United States Patent
Choe

(10) Patent No.: US 12,299,240 B2
(45) Date of Patent: May 13, 2025

(54) ELECTRONIC DEVICE COMPRISING CAPACITANCE SENSOR

(71) Applicant: Samsung Electronics Co., Ltd., Suwon-si (KR)

(72) Inventor: Jaewon Choe, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 129 days.

(21) Appl. No.: 18/178,214

(22) Filed: Mar. 3, 2023

(65) Prior Publication Data

US 2023/0205371 A1    Jun. 29, 2023

Related U.S. Application Data

(63) Continuation of application No. PCT/KR2021/011958, filed on Sep. 3, 2021.

(30) Foreign Application Priority Data

Sep. 4, 2020  (KR) .................. 10-2020-0113279

(51) Int. Cl.
*H01Q 1/24* (2006.01)
*G06F 3/044* (2006.01)
*H03H 7/38* (2006.01)

(52) U.S. Cl.
CPC ............. *G06F 3/044* (2013.01); *H01Q 1/243* (2013.01); *H03H 7/38* (2013.01)

(58) Field of Classification Search
CPC ............ H01Q 1/24; H01Q 1/243; H01Q 3/24; H01Q 5/00; H01Q 5/10; H01Q 5/371; H01Q 9/42; H03H 7/38; H03H 2007/013; H03K 17/955; H03K 2217/960755; G06F 3/044
See application file for complete search history.

(56) References Cited

U.S. PATENT DOCUMENTS 7,859,478 B2   12/2010   McLean
8,744,418 B2    6/2014   Novet
(Continued)

FOREIGN PATENT DOCUMENTS

CN   104993855 A   10/2015
CN   106200920 A   12/2016
(Continued)

OTHER PUBLICATIONS

International Search Report dated Nov. 29, 2021, issued in International Patent Application No. PCT/KR2021/011958.
(Continued)

*Primary Examiner* — Thai Pham
(74) *Attorney, Agent, or Firm* — Jefferson IP Law, LLP

(57) ABSTRACT

An electronic device is provided. The electronic device includes a first antenna, a second antenna, a communication circuit set to transmit and/or receive a signal in the frequency band selected or designated via the first antenna and/or the second antenna, a sensor integrated circuit (IC) which is electrically connected to the first antenna and the second antenna and measures a capacitance, a first capacitor connected to a first electrical path between the first antenna and the sensor IC, and a second capacitor connected to a second electrical path between the second antenna and the sensor IC.

19 Claims, 12 Drawing Sheets

(56) References Cited

U.S. PATENT DOCUMENTS

| | | | |
|---|---|---|---|
| 9,209,849 B2 | 12/2015 | Kim et al. | |
| 9,231,293 B2 | 1/2016 | Park et al. | |
| 9,709,960 B2 | 7/2017 | Cho et al. | |
| 10,122,081 B2 | 11/2018 | Black et al. | |
| 10,236,560 B2 | 3/2019 | Shin et al. | |
| 10,268,302 B2 | 4/2019 | Kwon et al. | |
| 10,559,873 B2 | 2/2020 | Kang et al. | |
| 10,637,128 B2 | 4/2020 | Heo | |
| 11,201,635 B2 | 12/2021 | Chu et al. | |
| 2015/0171916 A1* | 6/2015 | Asrani | H04M 1/0202 455/575.7 |
| 2015/0380812 A1* | 12/2015 | Black | H01Q 1/50 343/861 |
| 2016/0093943 A1 | 3/2016 | Yang et al. | |
| 2017/0331175 A1* | 11/2017 | Kwon | H01Q 9/42 |
| 2018/0212313 A1* | 7/2018 | Harper | H01Q 1/50 |
| 2018/0266805 A1 | 9/2018 | McCarthy et al. | |
| 2020/0136668 A1 | 4/2020 | Chu et al. | |
| 2021/0126633 A1 | 4/2021 | Jang et al. | |

FOREIGN PATENT DOCUMENTS

| | | |
|---|---|---|
| CN | 108092009 A | 5/2018 |
| CN | 111124040 A | 5/2020 |
| JP | 2015-162018 A | 9/2015 |
| JP | 6196174 B2 | 9/2017 |
| KR | 10-2007-0114611 A | 12/2007 |
| KR | 10-2010-0014517 A | 2/2010 |
| KR | 10-2013-0013089 A | 2/2013 |
| KR | 10-2015-0019352 A | 2/2015 |
| KR | 10-1591525 B1 | 2/2016 |
| KR | 10-2016-0080473 A | 7/2016 |
| KR | 10-2019-0023995 A | 3/2019 |
| KR | 10-2020-0049391 A | 5/2020 |
| WO | 2019/135622 A1 | 7/2019 |

OTHER PUBLICATIONS

Extended European Search Report dated Jan. 9, 2024, issued in European Application No. 21864729.5-1205.

Indian Office Action dated Sep. 17, 2024, issued in Indian Application No. 202317014422.

* cited by examiner

ELECTRONIC DEVICE COMPRISING CAPACITANCE SENSOR

CROSS-REFERENCE TO RELATED APPLICATION(S)

This application is a continuation application, claiming priority under § 365(c), of an International application No. PCT/KR2021/011958, filed on Sep. 3, 2021, which is based on and claims the benefit of a Korean patent application number 10-2020-0113279, filed on Sep. 4, 2020, in the Korean Intellectual Property Office, the disclosure of which is incorporated by reference herein in its entirety.

BACKGROUND

1. Field

The disclosure relates to an electronic device including a capacitance sensor.

2. Description of Related Art

An electronic device such as a smartphone may include a capacitance sensor. The capacitance sensor may be electrically connected to an antenna included in the electronic device. A magnetic field may be generated by a current flowing on the antenna and a magnetic field change (or capacitance change) may be caused when a dielectric substance approaches the electronic device. The capacitance sensor may generate a signal related to a state in which a dielectric substance is adjacent to the electronic device based on the capacitance change acquired through the antenna.

The above information is presented as background information only to assist with an understanding of the disclosure. No determination has been made, and no assertion is made, as to whether any of the above might be applicable as prior art with regard to the disclosure.

SUMMARY

An electronic device may identify a state in which a user's hand grips the electronic device (e.g., a grip state) by using a capacitance sensor (e.g., a grip sensor) electrically connected to, for example, an antenna. The electronic device may include multiple capacitance sensors to be able to identify a location (e.g., a grip location) at which the user's hand grips the electronic device. The multiple capacitance sensors may be electrically connected to multiple antennas included in the electronic device at different locations, respectively. However, the multiple capacitance sensors may cause difficulty in securing space for mounting other components or increase cost.

Aspects of the disclosure are to address at least the above-mentioned problems and/or disadvantages and to provide at least the advantages described below. Accordingly, an aspect of the disclosure is to provide an electronic device including a capacitance sensor (a grip sensor), which is capable of reducing the number of capacitance sensors and identifying various grip locations.

Additional aspects will be set forth in part in the description which follows and, in part, will be apparent from the description, or may be learned by practice of the presented embodiments.

In accordance with an aspect of the disclosure, an electronic device is provided. The electronic device includes a first antenna, a second antenna, a communication circuit configured to transmit and/or receive a signal in the frequency band selected or designated via the first antenna and/or the second antenna, a sensor integrated circuit (IC) electrically connected to the first antenna and the second antenna and configured to measure a capacitance; a first capacitor connected to a first electrical path between the first antenna and the sensor IC, and a second capacitor connected to a second electrical path between the second antenna and the sensor IC.

According to various embodiments of the disclosure, the number of capacitance sensors (e.g., a grip sensor) may be reduced, and various grip locations may be identified, thereby securing component mounting space or reducing cost.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
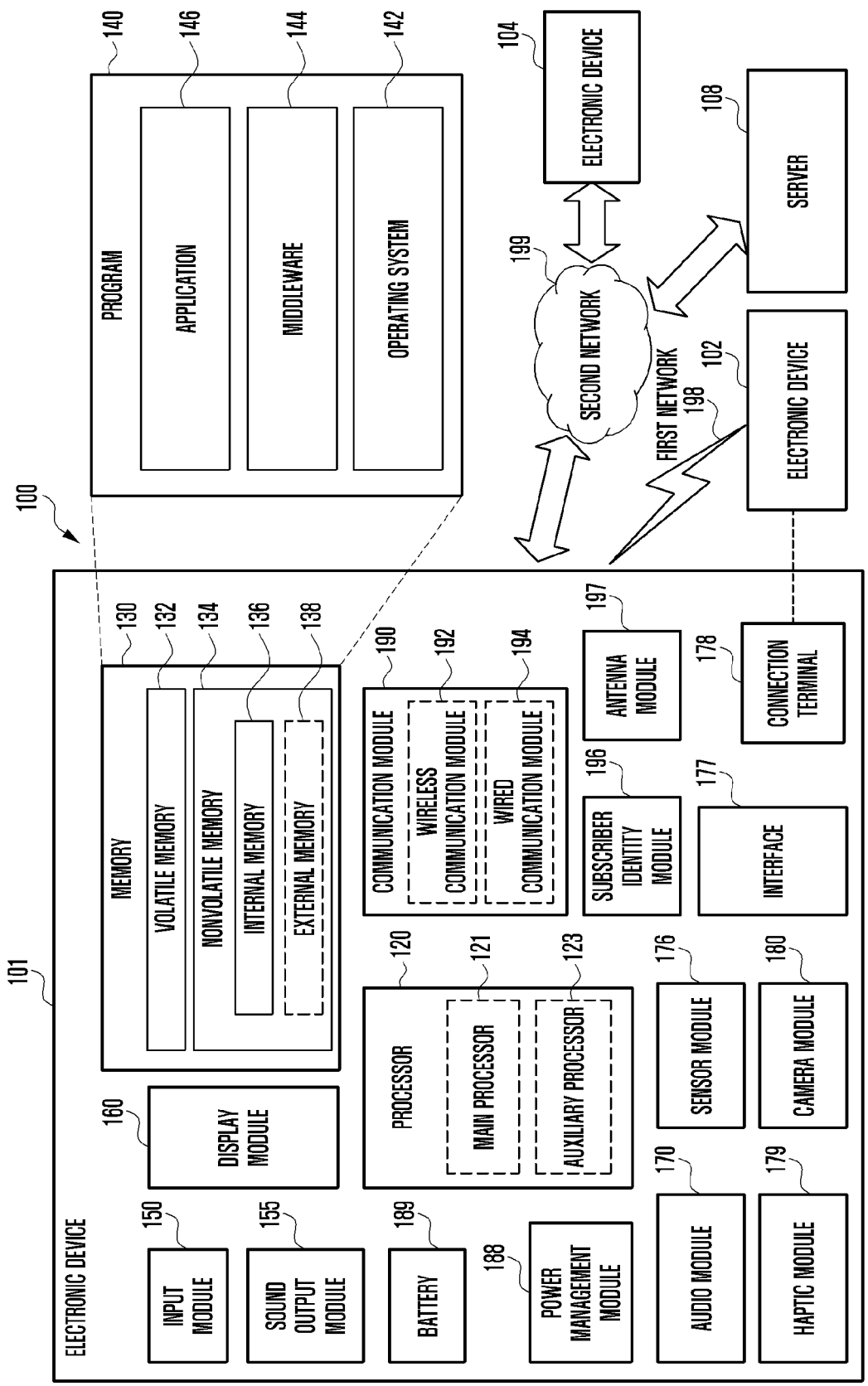
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In some embodiments, at least one of the components (e.g., the connection terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., the electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

The connection terminal 178 may include a connector via which the electronic device 101 may be physically connected with the external electronic device (e.g., the electronic device 102). According to an embodiment, the connection terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form an mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices (e.g., the electronic devices 102 and 104 or the server 108). For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it denotes that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply denotes that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
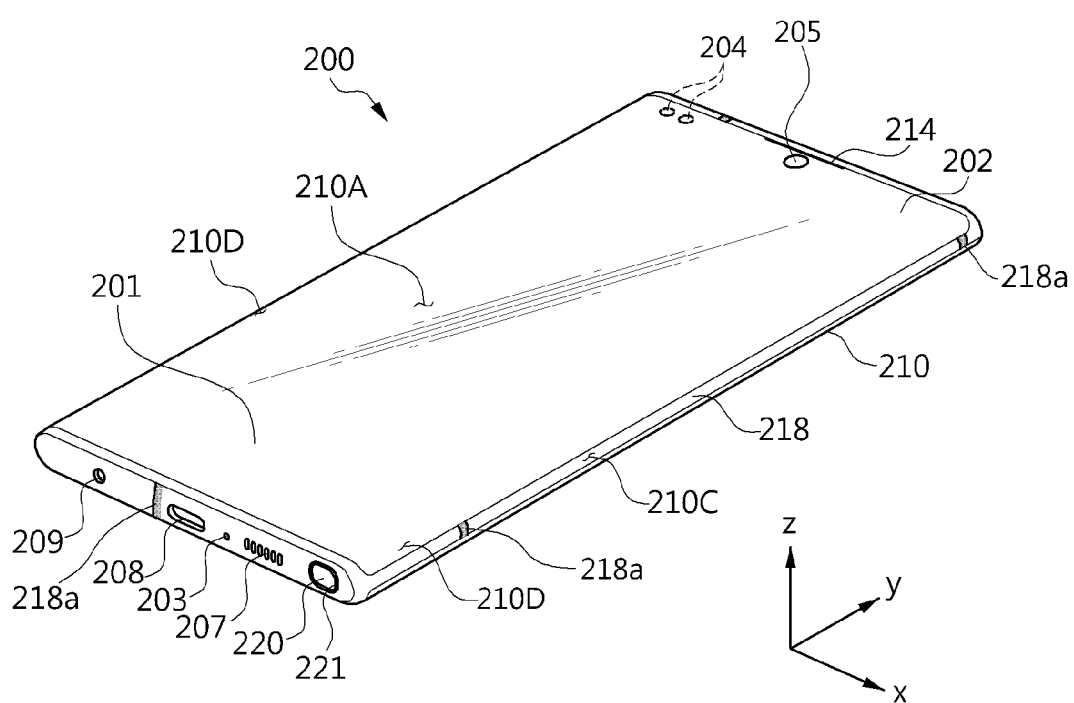
FIG. 2A is a front perspective view of a mobile electronic device according to an embodiment of the disclosure.
Figure 2B:
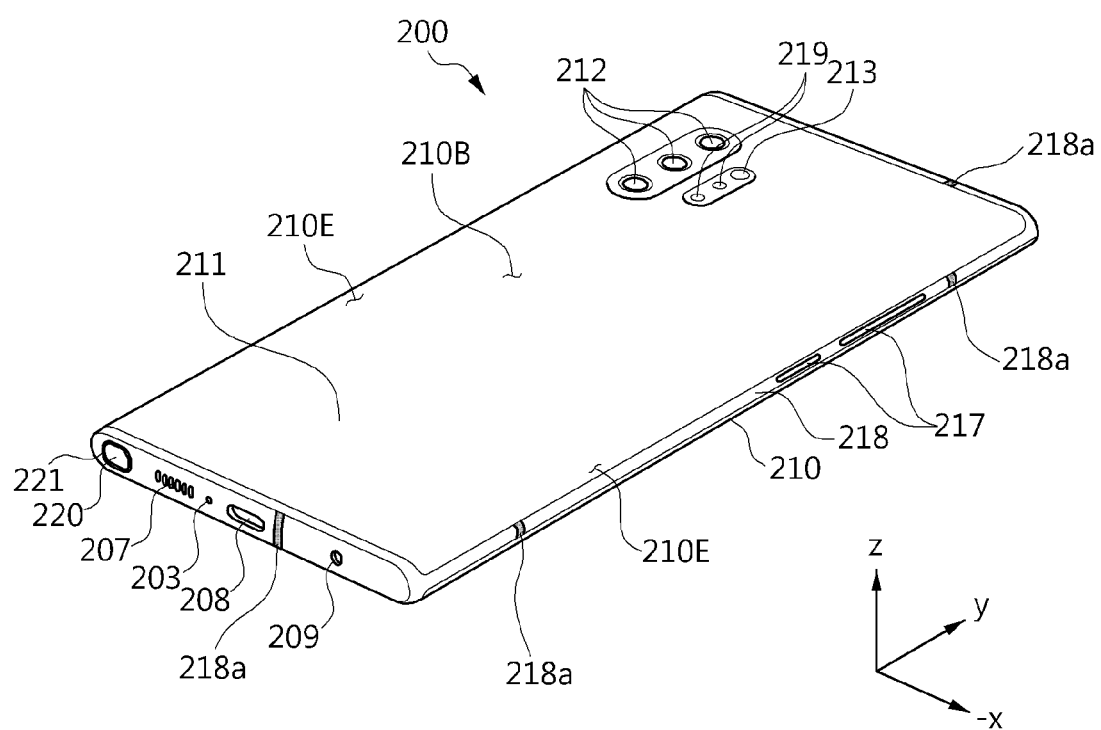
FIG. 2B is a rear perspective view of the electronic device in FIG. 2A according to an embodiment of the disclosure.

FIG. 2A is a front perspective view of a mobile electronic device according to an embodiment of the disclosure. FIG. 2B is a rear perspective view of the electronic device in FIG. 2A according to an embodiment of the disclosure.

According to various embodiments, electronic device 200 in FIG. 2A may include the electronic device 101 in FIG. 1.

Referring to FIGS. 2A and 2B, an electronic device 200 according to an embodiment may include a housing 210 including a first surface (or front surface) 210A, a second surface (or rear surface) 210B, and a lateral surface 210C surrounding a space between the first surface 210A and the second surface 210B. In another embodiment (not shown), the housing 210 may refer to a structure for configuring a portion of the first surface 210A, the second surface 210B, and the lateral surface 210C in FIG. 2A. According to an embodiment, at least a portion of the first surface 210A may be formed of substantially transparent front plate 202 (e.g., a glass plate including various coating layers or polymer plate). The second surface 210B may be formed of a substantially opaque rear plate 211. The rear plate 211 may be formed by, for example, coated or colored glass, ceramic, polymers, metals (for example, aluminum, stainless steel (STS), or magnesium), or a combination of at least two thereof. The lateral surface 210C may be coupled to the front plate 202 and the rear plate 211 and formed by a lateral bezel structure (or a "lateral member") 218 including a metal and/or polymer. In an embodiment, the rear plate 211 and the lateral bezel structure 218 may be integrally formed and include the same material (e.g., metal material such as aluminum).

In the embodiment shown in the drawing (see FIG. 2A), the front plate 202 may include two first areas 210D seamlessly extending from the first surface 210A to be bent toward the rear plate 211 at the opposite ends of a long edge of the front plate 202. In the embodiment described (see FIG. 2B), the rear plate 211 may include two second areas 210E seamlessly extending from the second surface 210B to be bent toward the front plate 202 at the opposite ends of the long edge. In an embodiment, the front plate 202 (or rear plate 211) may include only one of the first areas 210D (or second edge areas). In another embodiment, a portion of the first areas 210D or the second areas 210E is not included. In the embodiments, when viewed from a lateral side of the electronic device 200, the lateral bezel structure 218 may have a first thickness (or width) at a lateral surface in which the first areas 210D or the second areas 210E are not included, and may have a second thickness thinner than the first thickness at a lateral surface in which the first areas 210D or the second areas 210E are included.

According to an embodiment, the electronic device 200 may include at least one of a display 201, audio modules 203, 207, and 214, sensor modules 204 and 219, camera modules 205, 212, and 213, key input devices 217, a pen input device 220, and connector holes 208 and 209. In an embodiment, the electronic device 200 may omit at least one of components (e.g., the key input devices 217) or may additionally include another component (e.g., a fingerprint sensor or a light-emitting element).

The display 201 may be exposed through, for example, a substantial portion of the front plate 202. In some embodiments, at least a portion of the display 201 may be exposed through the front plate 202 configuring the first surface 210A and the first areas 210D of the lateral surface 210C. In some embodiments, an edge of the display 201 may be formed to be substantially identical to a shape of an outer periphery adjacent to the front plate 202. According to another embodiment (not shown), in order to expand an area through which the display 201 is exposed, a gap between an outer periphery of the display 201 and an outer periphery of the front plate 202 may be formed to be substantially identical.

In another embodiment (not shown), the display 201 may include a recess, an opening, or a transmission area formed on a part of a screen display area, and may include at least one of an audio module 214, a sensor module 204, and a camera module 205, which are arranged with the recess, the opening, or the transmission area. According to an embodiment, an area in which the display 201 faces the camera module 205 may be a portion of an area configured to display contents, and may be formed to be a transmission area having predetermined transmittance. According to an embodiment, the transmission area may be configured to have transmittance in a range of about 5% to about 20%. Such transmission area may include an area overlapping an effective area (e.g., a view-angle region) of the camera module 205 through which light for imaging to an image sensor so as to generate an image passes. For example, the transmission area of the display 201 may include an area having a lower pixel density than a peripheral area. For example, the transmission area may be substituted with the opening. For example, the camera module 205 may include an under-display camera (UDC). In another embodiment (not shown), the display 201 may include at least one of an audio module 214, a sensor module 204, and a camera module 205 on a rear surface of a screen display area. In another embodiment (not shown), the display 201 may be combined to or disposed adjacent to a touch sensing circuit, a pressure sensor for measuring a strength (pressure) of a touch, and/or a digitizer for detecting a magnetic field-type stylus pen. In an embodiment, at least a portion of the sensor modules 204 and 219 and/or at least a portion of the key input devices 217 may be disposed in the first areas 210D and/or the second areas 210E.

The audio modules 203, 207, and 214 may include a microphone hole (e.g., the audio module 203) and speaker holes (e.g., the audio modules 207 and 214). A microphone for obtaining a sound from the outside may be disposed in the microphone hole and in an embodiment, multiple microphones may be arranged to detect a direction of a sound. The speaker holes may include an outer speaker hole (e.g., the audio module 207) and a receiver hole (e.g., the audio module 214) for calling. In an embodiment, speaker holes and a microphone hole may be integrated into one hole or a speaker may be included without a speaker hole (e.g., a piezo speaker).

The sensor modules 204 and 219 may generate an electrical signal or a data value corresponding to an internal operation state or external environment state of the electronic device 200. The sensor modules 204 and 219 may include a first sensor module 204 (e.g., a proximity sensor) and/or a second sensor module (not shown) (e.g., a fingerprint sensor) disposed to correspond to the first surface 210A inside the housing 210, and/or a third sensor module 219 (e.g., an HRM sensor) and/or a fourth sensor module (e.g., a fingerprint sensor) disposed on the second surface 210B of the housing 210. The fingerprint sensor may be disposed on the second surface 210B. The electronic device 200 may further include at least one sensor module not shown in the drawings, for example, a gesture sensor, a gyro sensor, an air pressure sensor, a magnetic sensor, an acceleration sensor, a grip sensor, a color sensor, an infrared (IR) sensor, a biometric sensor, a temperature sensor, humidity sensor, or an illuminance sensor (e.g., the first sensor module 204).

The camera modules 205, 212, and 213 may include, for example, a first camera device (e.g., the camera module 205) disposed on the first surface 210A inside the housing 210 and a second camera device (e.g., the camera module 212) disposed on the second surface 210B, and/or a flash (e.g., the camera module 213). The first camera device and the second camera device may include one or more of lenses, an image sensor, and/or an image signal processor. The flash may include, for example, a light-emitting diode or a xenon lamp. In an embodiment, two or more lenses (infrared camera, wide-angle, and telephoto lenses) and image sensors may be arranged on one surface of the electronic device 200.

The key input devices 217 may be disposed on the lateral surface 210C of the housing 210. In another embodiment, the electronic device 200 may not include a portion or the entirety of the key input devices 217, and the excluded key input devices 217 may be implemented as various forms, such as a soft key, on the display 201. In an embodiment, the key input device may include a sensor module (not shown) disposed at the second surface 210B of the housing 210.

The light emitting element (not shown) may be located to correspond to the first surface 210A inside the housing 210. The light-emitting element may provide state information of the electronic device 200 in a form of light, for example. In another embodiment, the light-emitting element may provide, for example, a light source associated with an operation of the camera module 205. The light-emitting element may include, for example, an LED, an infrared LED (IR LED), or a xenon lamp.

The connector holes 208 and 209 may include a first connector hole 208 capable of receiving a connector (e.g., a USB connector) for transmitting or receiving power and/or data to or from an external electronic device, and/or a second connector hole (e.g., an earphone jack) 209 capable of receiving a connector for transmitting or receiving an audio signal to or from an external electronic device.

The pen input device 220 (e.g., stylus pen) may be guided to the inside of the housing 210 through a hole 221 formed on the lateral surface 210C of the housing 210 to be inserted into or separated from the same, and may include a button for easy detachment or attachment. The pen input device 220 may include a separate resonance circuit installed therein to link to an electromagnetic induction panel (e.g., electromagnetic induction panel 390 in FIG. 3) in the electronic device 200. According to an embodiment, the pen input device 220 may include an electromagnetic resonance method (e.g., an electro-magnetic resonance (EMR) method).

According to various embodiments, the pen input device 220 may be implemented in an electro-magnetic resonance (EMR) method, an active electrical stylus (AES), or an electric coupled resonance (ECR) method. The electromagnetic panel of the electronic device 200 may be omitted depending on an implementation method of the pen input device 220.

Figure 3:
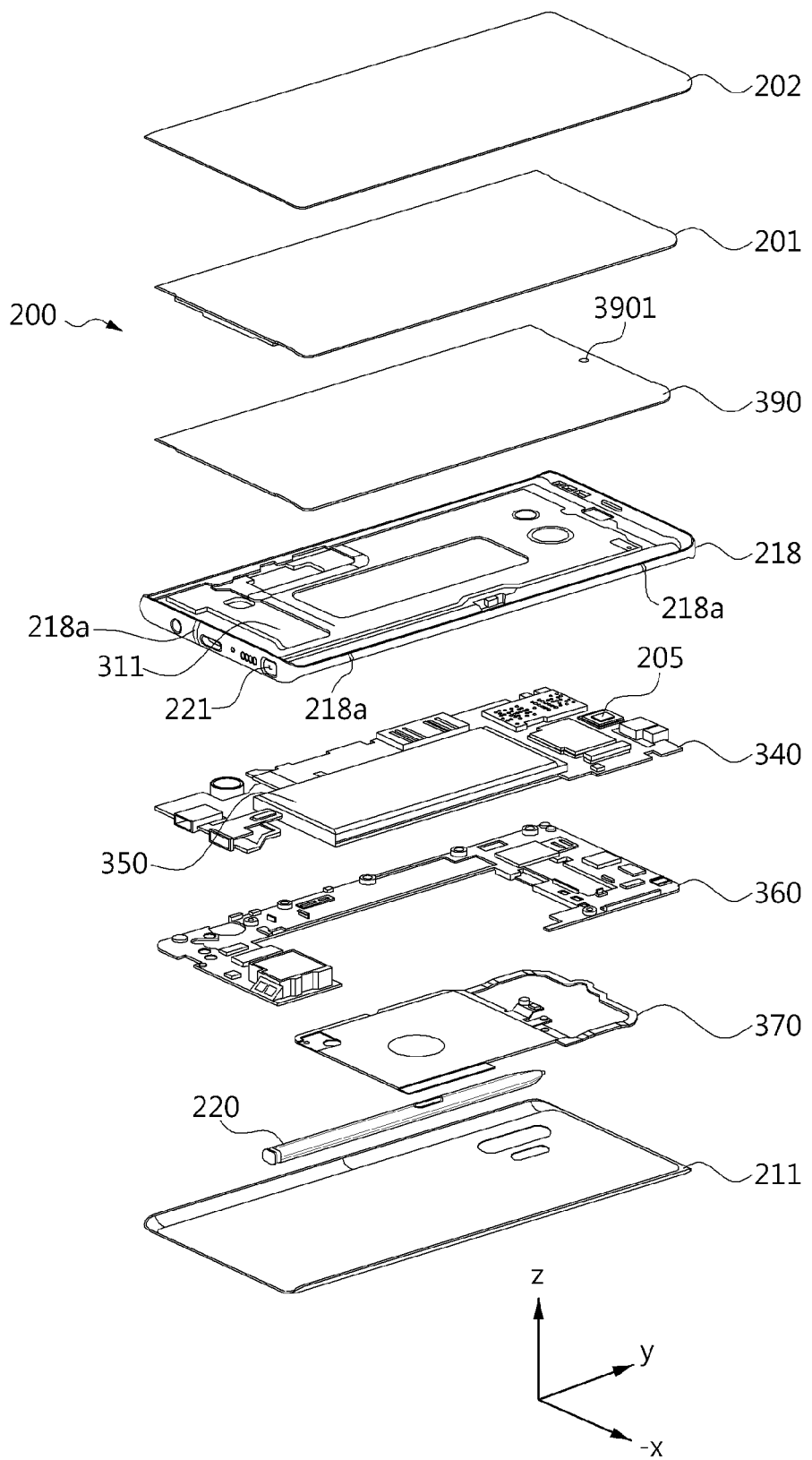
FIG. 3 is an exploded perspective view of the electronic device in FIG. 2A according to an embodiment of the disclosure.

FIG. 3 is an exploded perspective view of the electronic device in FIG. 2A according to an embodiment of the disclosure.

Referring to FIG. 3, an electronic device 200 may include a lateral bezel structure 218, a first support member 311 (e.g., a bracket), a front plate 202, a display 201, an electromagnetic induction panel 390, a printed circuit board 340, a battery 350, a second support member 360 (e.g., a rear case), an antenna 370, a pen input device 220, or a rear plate 211. In an embodiment, the electronic device 200 may omit at least one of the components (e.g., the first support member 311 or the second support member 360) or additionally include another component. At least one of the components of the electronic device 200 may be the same as or similar to at least one of the components of the electronic device 200 in FIGS. 2A or 2B, and thus an overlapping description thereof will be omitted.

According to an embodiment, the electromagnetic induction panel 390 (e.g., a digitizer) may be a panel for detecting an input of the pen input device 220. For example, the electromagnetic induction panel 390 may include a printed circuit board (PCB) (e.g., a flexible printed circuit board (FPCB)) and a shield sheet. The shield sheet may prevent the components from a mutual interference caused by an electromagnetic field generated by components (e.g., a display module, a printed circuit board, an electromagnetic induction panel, and the like) included in the electronic device 200. The shield sheet may block an electromagnetic field generated by the components and may thus allow an input from the pen input device 220 to be correctly transmitted to a coil included in the electromagnetic induction panel 390. The electromagnetic induction panel 390 according to various embodiments may include an opening 3901 formed on at least a partial area corresponding to an optical sensor (e.g., the camera module 205 or a biometric sensor) disposed inside the electronic device 200.

The first support member 311 may be disposed, for example, in the electronic device 200 to be connected to the lateral bezel structure 218 or may be integrally formed with the lateral bezel structure 218. The first support member 311 may be formed of, for example, a metal material and/or a non-metal (for example, polymer) material. The display 201 may be coupled to one surface of the first support member 311 and the printed circuit board 340 may be coupled to the other surface of the first support member 311. A processor, a memory, and/or an interface may be mounted to the printed circuit board 340. The processor may include one or more of, for example, a central processing unit, an application processor, a graphic processing unit, an image signal processor, a sensor herb processor, or a communication processor. The memory may include, for example, a transitory memory or a non-transitory memory. The interface may include, for example, a high-definition multimedia interface (HDMI), a universal serial bus (USB) interface, an SD card interface, and/or an audio interface. The interface, for example, may electrically or physically connect the electronic device 300 to an external electronic device, and may include a USB connector, an SD card/MMC connector, or an audio connector.

The battery 350 is a device for supplying power to at least one component of the electronic device 200, and may include, for example, a non-rechargeable primary battery, or a rechargeable secondary battery, or a fuel cell. At least a portion of the battery 350 may be disposed on a substantially identical plane to the printed circuit board 340. The battery 350 may be disposed and integrally formed in the electronic device 200 or may be disposed to be attachable to/detachable from the electronic device 200.

The antenna 370 may be interposed between the rear plate 211 and the battery 350. The antenna 370 may include, for example, a near field communication (NFC) antenna, a wireless charging antenna, and/or a magnetic secure transmission (MST) antenna. The antenna 370 may transmit and receive power required for charging or perform near field communication with an external device, for example. In another embodiment, an antenna structure may be formed by a portion or a combination of the lateral bezel structure 218 and/or the first support member 311.

According to an embodiment, when viewed from above the front plate 202 (e.g., viewed from the -z-axis direction), at least one electronic component (e.g., the sensor module 204 or the camera module 205 in FIG. 2A) may be located to at least partially overlap the display 201. Here, the at least one electronic component may be disposed between the display 201 and the electromagnetic induction panel 390 or between the electromagnetic induction panel 390 and the first support member 311. In an embodiment in which the at least one electronic component is disposed between the electromagnetic induction panel 390 and the first support member 311, the electromagnetic induction panel 390 may include an opening corresponding to the at least one electronic component. According to an embodiment, the at least one electronic component may be disposed between the first support member 311 and the printed circuit board 340, and in this case, the electromagnetic induction panel 390 and the first support member 311 may each include an opening corresponding thereto.

In an embodiment, at least one electronic component (e.g., the camera module 205 and/or the sensor module 204 in FIG. 2A) may be disposed at a lower end (e.g., the -z-axis direction) of at least a partial area of a screen (e.g., a screen display area or an active area) of the display 201. For example, the at least one electronic component may be located on a rear surface of a screen or below the screen. According to an embodiment, the at least one electronic component may be aligned in a recess formed on the rear surface of the display 201 and located inside the electronic device 200. The location of the at least one electronic component may not be visually distinguished (or exposed) and the at least one electronic component may perform a related function. For example, when viewed from above the screen (e.g., viewed from the -z-axis direction), the camera module 205 may be disposed to overlap at least a portion of the screen and may acquire an image of an external object while not being exposed to the outside. For example, when viewed from above the screen, the sensor module 204 may be disposed to overlap at least a portion of the screen and may perform a corresponding sensing function while not being exposed to the outside. A partial area of the display 201 at least partially overlapping the at least one electronic component may include a different pixel structure and/or a wire structure compared to other areas. For example, the partial area of the display 201 at least partially overlapping the at least one electronic component may include a different pixel density compared to other areas. The pixel structure and the wire structure formed on the partial area of the display 201 at least partially overlapping the at least one electronic component may reduce loss of various forms of signals (e.g., optical or ultrasound) related to the at least one electronic component, when the various forms of signals pass between the outside and the at least one electronic component. According to some embodiments, multiple pixels may not be arranged on the partial area of the display 201 at least partially overlapping the at least one electronic component. According to another embodiment, the at least one electronic component may be aligned in an opening (e.g., a through-hole or a notch) formed on the display 201 and located inside the electronic device 200. According to an embodiment, the second support member 360 may be disposed between the first support member 311 and the rear plate 211 and coupled to the first support member 311 through a fastening element such as a bolt. At least a portion of the printed circuit board 340 may be disposed between the first support member 311 and the second support member 360 and the second support member 360 may cover and protect the printed circuit board 340.

According to an embodiment, the first support member 311 may include a conductive part and a non-conductive part connected to the conductive part. The conductive part and the lateral bezel structure 218 may be integrally formed and include the same material. The non-conductive part may be formed in a form combined with a first conductive portion through, for example, insert injection. Referring to FIGS. 2A, 2B, and 3, in an embodiment, the lateral bezel structure 218 may include multiple conductive parts separated with a segmental part interposed therebetween. The non-conductive part of the first support member 311 may extend to the segmental part to form insulation parts 218a between multiple conductive parts of the lateral bezel structure 218. The insulation parts 218a may form a portion of the lateral surface 210C (see FIGS. 2A or 2B).

According to various embodiments (not shown), the electronic device 200 may further include various components according to a provision form. Such components have various variations according to a convergence trend of the electronic device 200, thus may not be enumerated all, and components equivalent to those mentioned above may be additionally included in the electronic device 200. According to various embodiments, specific components may be omitted from the components or substituted with other components according to a provision form.

Figure 4:
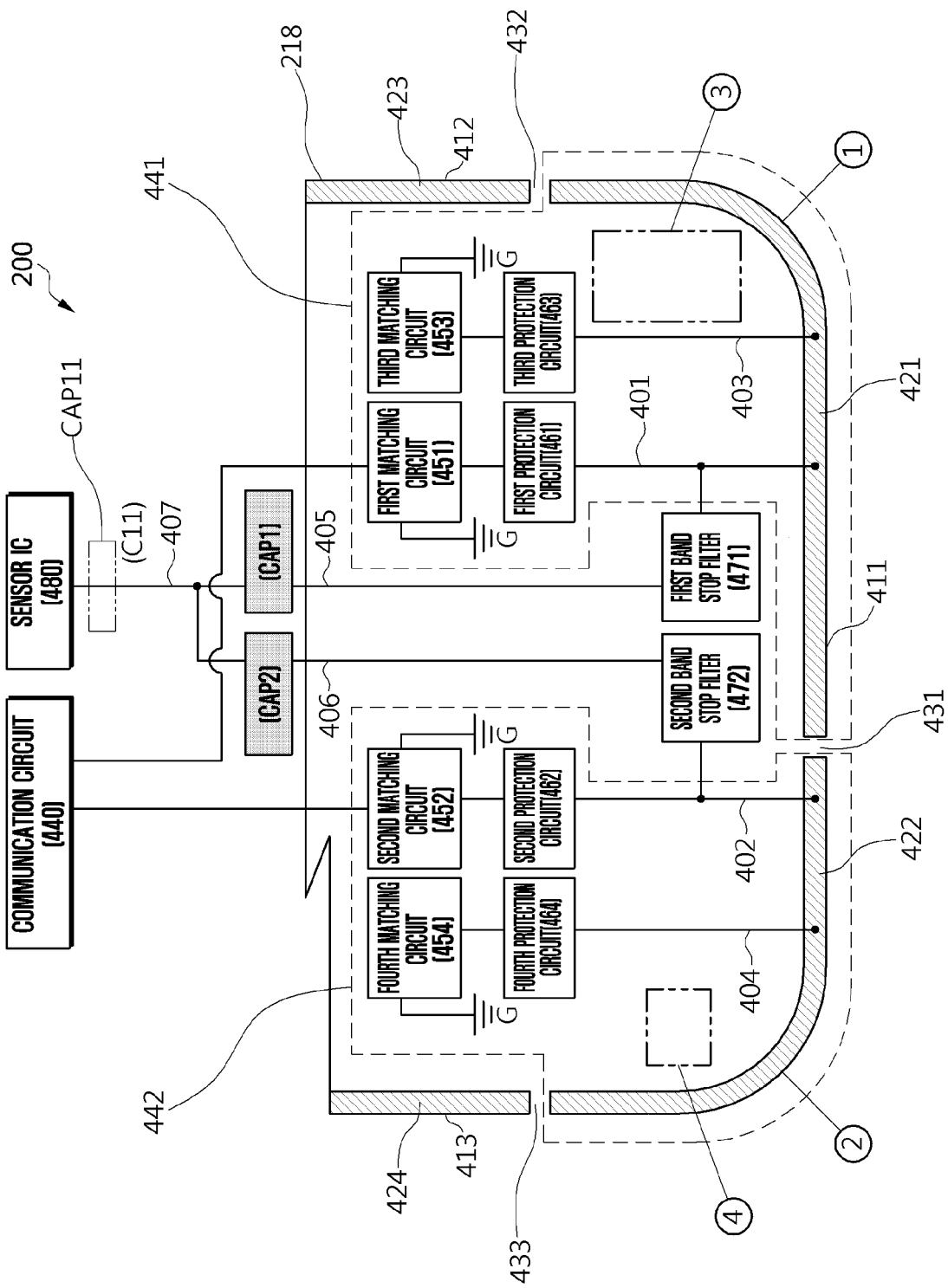
FIG. 4 is a block diagram related to the electronic device in FIG. 2A according to an embodiment of the disclosure.

FIG. 4 is a block diagram related to the electronic device in FIG. 2A according to an embodiment of the disclosure.

Referring to FIG. 4, in an embodiment, an electronic device 200 may include a first antenna 441, a second antenna 442, a communication circuit 440 and/or a sensor IC 480. The first antenna 441 and the second antenna 442 may be electrically connected to the communication circuit 440 (e.g., the wireless communication module 192 in FIG. 1). The sensor IC 480 may be electrically connected to the first antenna 441 and the second antenna 442.

According to an embodiment, the first antenna 441 may include a first antenna radiator ①, a ground (or an antenna ground) G electrically connected to the first antenna radiator ①, or a first electrical path 401 between the first antenna radiator ① and the communication circuit 440. The ground G may include, for example, a ground (e.g., a ground plane) included in the printed circuit board 340 in FIG. 3. The first electrical path 401 may be a first transmission line configured to transfer a signal (a voltage or current) in a radio frequency (RF). For example, the communication circuit 440 may provide a radiation current to the first antenna radiator ① through the first electrical path 401 and the first antenna radiator ① may form an electromagnetic field capable of transmitting and/or receiving a signal in a selected or predetermined frequency band. The first electrical path 401 may be realized in various forms of conductive structure or conductive patterns configured to connect the communication circuit 440 and the first antenna radiator ①.

According to an embodiment, the second antenna 442 may include a second antenna radiator ②, a ground (or an antenna ground) G electrically connected to the second antenna radiator ②, or a second electrical path 402 between the second antenna radiator ② and the communication circuit 440. The second electrical path 402 may be a second transmission line configured to transfer a signal (a voltage or current) in an RF. For example, the communication circuit 440 may provide a radiation current to the second antenna radiator ② through the second electrical path 402 and the second antenna radiator ② may form an electromagnetic field capable of transmitting and/or receiving a signal in a selected or predetermined frequency band. The second electrical path 402 may be realized in various forms of conductive structure or conductive patterns configured to connect the communication circuit 440 and the second antenna radiator ②.

According to an embodiment, the communication circuit 440 may be configured to transmit and/or receive a signal in a selected or predetermined frequency band through the first antenna 441 and the second antenna 442. For example, the predetermined frequency band may include at least one of a low band (LB) (about 600 MHz to about 1 GHz), a middle band (MB) (about 1 GHz to about 2.2 GHz), a high band (HB) (about 2.2 GHz to about 2.7 GHz), or an ultra-high band (UHB) (about 2.7 GHz to about 3.6 GHz). The predetermined frequency band may include various other frequency bands. According to various embodiments, the communication circuit 440 may include a first communication circuit for the first antenna 441 and a second communication circuit for the second antenna 442.

According to an embodiment, the first antenna radiator ① and the second antenna radiator ② may include at least a portion of the lateral bezel structure 218 included in the electronic device 200. The lateral bezel structure 218 may form the lateral surface 210C (see FIG. 2A) of the electronic device 200 and may include a first lateral surface 411 facing a first direction, a second lateral surface 412 facing a second direction perpendicular to the first direction, and a third lateral surface 413 facing a third direction opposite to the second direction. Although not shown in the drawing, the lateral bezel structure 218 may include a fourth lateral surface perpendicular to the second lateral surface 412 or the third lateral surface 413 and spaced apart from the first lateral surface 411. The lateral bezel structure 218 may include a first conductive part 421, a second conductive part 422, a third conductive part 423, or a fourth conductive part 424. The lateral bezel structure 218 may include a segmental part 431 between the first conductive part 421 and the second conductive part 422, a segmental part 432 between the first conductive part 421 and the third conductive part 423, and/or a segmental part 433 between the second conductive part 422 and the fourth conductive part 424. The first conductive part 421 may form a portion of the first lateral surface 411 and/or a portion of the second lateral surface 412. The second conductive part 422 may form a portion of the first lateral surface 411 and/or a portion of the third lateral surface 413. The third conductive part 423 may form a portion of the second lateral surface 412. The fourth conductive part 424 may form a portion of the third lateral surface 413. According to various embodiment, the number of segmental parts or the locations of the segmental parts may vary without limitation to the embodiment of FIG. 4. At least a portion of the multiple conductive parts (e.g., the first conductive part 421, the second conductive part 422, the third conductive part 423, and/or the fourth conductive part 424) of the lateral bezel structure 218 may be electrically connected to the communication circuit 440 to operate as an antenna radiator. According to an embodiment, at least a portion of the first conductive part 421 may operates as the first antenna radiator ① and at least a portion of the second conductive part 422 may operate as the first antenna radiator ①.

According to an embodiment, the first antenna 441 may include a first matching circuit 451 disposed in the first electrical path 401. The first matching circuit 451 may perform matching of an impedance of the first electrical path 401 (e.g., the first transmission line) and an impedance of the first antenna radiator ①. The first matching circuit 451 may reduce reflection in a selected or predetermined frequency related to the first antenna 441 and may allow maximum power transfer (or minimized power loss) or efficient signal transfer through the first antenna radiator ① in a selected or predetermined frequency. According to various embodiments, the first matching circuit 451 may move a resonance frequency of the first antenna radiator ① to a predetermined frequency or by a predetermined degree.

According to an embodiment, the second antenna 442 may include a second matching circuit 452 disposed in the second electrical path 402. The second matching circuit 452 may perform matching of an impedance of the second electrical path 402 (e.g., the second transmission line) and an impedance of the second antenna radiator ②. The second matching circuit 452 may reduce reflection in a selected or predetermined frequency related to the second antenna 442 and may allow maximum power transfer (or minimized power loss) or efficient signal transfer through the second antenna radiator ② in a selected or predetermined frequency. According to various embodiments, the second matching circuit 452 may move a resonance frequency of the second antenna radiator ② to a predetermined frequency or by a predetermined degree.

According to an embodiment, the first antenna 441 may further include a third matching circuit 453 between the first antenna radiator ① and the ground G. The third matching circuit 453 may be disposed in a third electrical path 403 between the first antenna radiator ① and the ground G. The third matching circuit 453 may contribute to matching between an impedance of the first antenna radiator ① and an impedance of the first transmission line (e.g., the first electrical path 401). According to various embodiments, the third matching circuit 453 may move a resonance frequency of the first antenna radiator ① to a predetermined frequency or by a predetermined degree.

According to various embodiments, the second antenna 442 may further include a fourth matching circuit 454 between the second antenna radiator ② and the ground G. The fourth matching circuit 454 may be disposed in a fourth electrical path 404 between the second antenna radiator ② and the ground G. The fourth matching circuit 454 may contribute to matching between an impedance of the second antenna radiator ② and an impedance of the second transmission line (e.g., the second electrical path 402). According to various embodiments, the fourth matching circuit 454 may move a resonance frequency of the second antenna radiator ② to a predetermined frequency or by a predetermined degree.

According to various embodiments, the first matching circuit 451, the second matching circuit 452, the third matching circuit 453, or the fourth matching circuit 454 may include various lumped elements (or passive elements) such as an inductor or a capacitor.

According to an embodiment, the first antenna 441 may include a first protection circuit 461 disposed in the first electrical path 401. The first protection circuit 461 may be disposed in the first electrical path 401 between the first matching circuit 451 and the first antenna radiator ①. The second antenna 442 may include a second protection circuit 462 connected to the second electrical path 402. The second protection circuit 462 may be disposed in the second electrical path 402 between the second matching circuit 452 and the second antenna radiator ②. The first antenna 441 may include a third protection circuit 463 disposed in the third electrical path 403. The third protection circuit 463 may be disposed in the third electrical path 403 between the third matching circuit 453 and the first antenna radiator ①. The second antenna 442 may include a fourth protection circuit 464 connected to the fourth electrical path 404. The fourth protection circuit 464 may be disposed in the fourth electrical path 404 between the fourth matching circuit 454 and the second antenna radiator ②. The first protection circuit 461, the second protection circuit 462, the third protection circuit 463, and/or the fourth protection circuit 464 may protect a user from direct current (DC) current caused by the electronic device 200. For example, the first protection circuit 461, the second protection circuit 462, the third protection circuit 463, or the fourth protection circuit 464 may protect a user from an electric shock by preventing a DC current from flowing to the first antenna radiator ① or the second antenna radiator ②. According to an embodiment, the first protection circuit 461, the second protection circuit 462, the third protection circuit 463, or the fourth protection circuit 464 may include a varistor.

According to an embodiment, the electronic device 200 may include a fifth electrical path 405 between the sensor IC 480 and the first antenna 441. For example, the fifth electrical path 405 may be electrically connected to a point on the first electrical path 401 between the first antenna radiator ① and the first protection circuit 461. According to various embodiments, the fifth electrical path 405 may be electrically connected to another point of the first electrical path 401 without limitation to the embodiment of FIG. 4. For example, the fifth electrical path 405 may be electrically connected to the first antenna radiator ①.

According to an embodiment, the electronic device 200 may include a sixth electrical path 406 between the sensor IC 480 and the second antenna 442. For example, the sixth electrical path 406 may be electrically connected to a point on the second electrical path 402 between the second antenna radiator ② and the second protection circuit 462. According to various embodiments, the sixth electrical path 406 may be electrically connected to another point of the second electrical path 402 without limitation to the embodiment of FIG. 4. For example, the sixth electrical path 406 may be electrically connected to the second antenna radiator ②.

According to an embodiment, the electronic device 200 may include a first band stop filter 471 connected to the fifth electrical path 405. The first band stop filter 471 may separate a frequency band utilized by the first antenna 441 and a frequency band utilized by the sensor IC 480 and thus may reduce interference therebetween to secure antenna radiation performance of the first antenna 441 and sensing performance of the sensor IC 480. For example, in case that the communication circuit 440 transmits and/or receives a first frequency signal (e.g., a first RF signal) in a first frequency band through the first antenna 441, the first band stop filter 471 may substantially prevent the first frequency signal from being transferred to the sensor IC 480 through the fifth electrical path 405. According to an embodiment, the first band stop filter 471 may include an inductor connected in series between the first antenna 441 and the sensor IC 480.

According to an embodiment, the electronic device 200 may include a second band stop filter 472 connected to the sixth electrical path 406. The second band stop filter 472 may separate a frequency band utilized by the second antenna 442 and a frequency band utilized by the sensor IC 480 and thus may reduce interference therebetween to secure antenna radiation performance of the second antenna 442 and sensing performance of the sensor IC 480. For example, in case that the communication circuit 440 transmits and/or receives a second frequency signal (e.g., a second RF signal) in a second frequency band through the second antenna 442, the second band stop filter 472 may substantially prevent the second frequency signal from being transferred to the sensor IC 480 through the sixth electrical path 406. According to an embodiment, the second band stop filter 472 may include an inductor connected in series between the second antenna 442 and the sensor IC 480.

According to an embodiment, the sensor IC 480 may measure a capacitance in a third frequency band different from the first frequency band for the first antenna 441 and the second frequency band for the second antenna 442. The third frequency band may be lower than the first frequency band and the second frequency band. The third frequency band may include, for example, a frequency band of about 1 MHz to about 13 MHz.

For example, the first antenna radiator ① may generate an electric field related to the third frequency band when a current is supplied from the communication circuit 440. The second antenna radiator ② may generate an electric field with respect to the third frequency band when a current is supplied from the communication circuit 440.

According to another embodiment, the sensor IC 480 (or the capacitance sensor) may provide a signal (e.g., a current) in the third frequency band to the first antenna radiator ① and the first antenna radiator ① may generate an electric field related to the third frequency band. The sensor IC 480 may provide a signal in the third frequency band to the second antenna radiator ② and the second antenna radiator ② may generate an electric field with respect to the third frequency band.

According to various embodiments, the first antenna radiator ① and the second antenna radiator ② may be realized to satisfy both frequency properties of a communication antenna and frequency properties of a sensing antenna.

According to an embodiment, the electric field in the third frequency generated by the first antenna radiator ① and the electric field in the third frequency generated by the second antenna radiator ② may be changed depending on a spatial or locational relationship between dielectric substances such as the electronic device 200 and a hand. For example, when a user carries the electronic device 200 in the right hand causing the second surface 210B (see FIG. 2B) to face the palm, the right hand contacts the first antenna radiator ① in a larger area than the second antenna radiator ② and thus may affect the first antenna radiator ①substantially greater than the second antenna radiator ②. For example, when a user carries the electronic device 200 in the left hand causing the second surface 210B (see FIG. 2B) to face the palm, the left hand contacts the second antenna radiator ②in a larger area than the first antenna radiator ①and thus may affect the second antenna radiator ②substantially greater than the first antenna radiator ①.

According to an embodiment, the electronic device 200 may include a first capacitor CAP1 connected to the fifth electrical path 405. The electronic device 200 may include a second capacitor CAP2 connected to the sixth electrical path 406. In an embodiment, the sensor IC 480 may determine whether a dielectric substance approaches or contacts which one of the first antenna radiator ①or the second antenna radiator ②by using the first capacitor CAP1 or the second capacitor CAP2. In an embodiment, the first capacitor CAP1 may substantially involve in a capacitance with respect to a "first state" in which a dielectric substance approaches or contacts the first antenna radiator ①among the first antenna radiator ①or the second antenna radiator ②. In an embodiment, the second capacitor CAP2 may involve in a capacitance with respect to a "second state" in which a dielectric substance approaches or contacts the second antenna radiator ②among the first antenna radiator ①or the second antenna radiator ②. For example, when a user carries the electronic device 200 in the right hand causing the second surface 210B (see FIG. 2B) to face the palm, the right hand may be substantially more in contact with the first antenna radiator ①than the second antenna radiator ②. For example, when a user carries the electronic device 200 in the left hand causing the screen to face the palm, the left hand may be substantially more in contact with the second antenna radiator ②than the first antenna radiator ①. For example, when a user carries the electronic device 200 in the left hand causing the second surface 210B (see FIG. 2B) to face the palm, the left hand may be substantially more in contact with the second antenna radiator ②than the first antenna radiator ①. For example, when a user carries the electronic device 200 in the right hand causing the screen to face the palm, the right hand may be substantially more in contact with the first antenna radiator ①than the second antenna radiator ②. Hereinafter, in order to easily explain the technical content according to embodiments of the disclosure and to help the understanding of the embodiments of the disclosure, the first state will be described as a first grip state, and the second state will be described as a second grip state based on an example of holding the electronic device 200 by hand. In the first grip state, for example, a hand of a user may be more in contact with the second antenna radiator ②than the first antenna radiator ①. In the second grip state, for example, a hand of a user may be more in contact with the first antenna radiator ①than the second antenna radiator ②. A method for determining the first grip state or the second grip state by using the first capacitor CAP 1 and the second capacitor CAP 2 will be described below with reference to FIGS. 5, 6A, and 6B.

According to various embodiments, instead of the first antenna radiator ①, a third antenna radiator ③located in the internal space of the electronic device 200 may be implemented. Here, the first protection circuit 461 and/or the third protection circuit 463 may be omitted. According to various embodiments, instead of the second antenna radiator ②, a fourth antenna radiator ④located in the internal space of the electronic device 200 may be implemented. Here, the second protection circuit 462 and/or the fourth protection circuit 464 may be omitted. For example, the third antenna radiator ③and/or the fourth antenna radiator ④may include a conductive pattern disposed in the housing 210 in FIG. 2A. For another example, the third antenna radiator ③and/or the fourth antenna radiator ④may include a conductive pattern (e.g., a microstrip) disposed on the printed circuit board 340 in FIG. 3.

According to various embodiments, the first matching circuit 451 or the third matching circuit 453 may be omitted. For another example, the first protection circuit 461 or the third protection circuit 463 may be omitted.

According to various embodiments, the second matching circuit 452 or the fourth matching circuit 454 may be omitted. For another example, the second protection circuit 462 or the fourth protection circuit 464 may be omitted.

Figure 5:
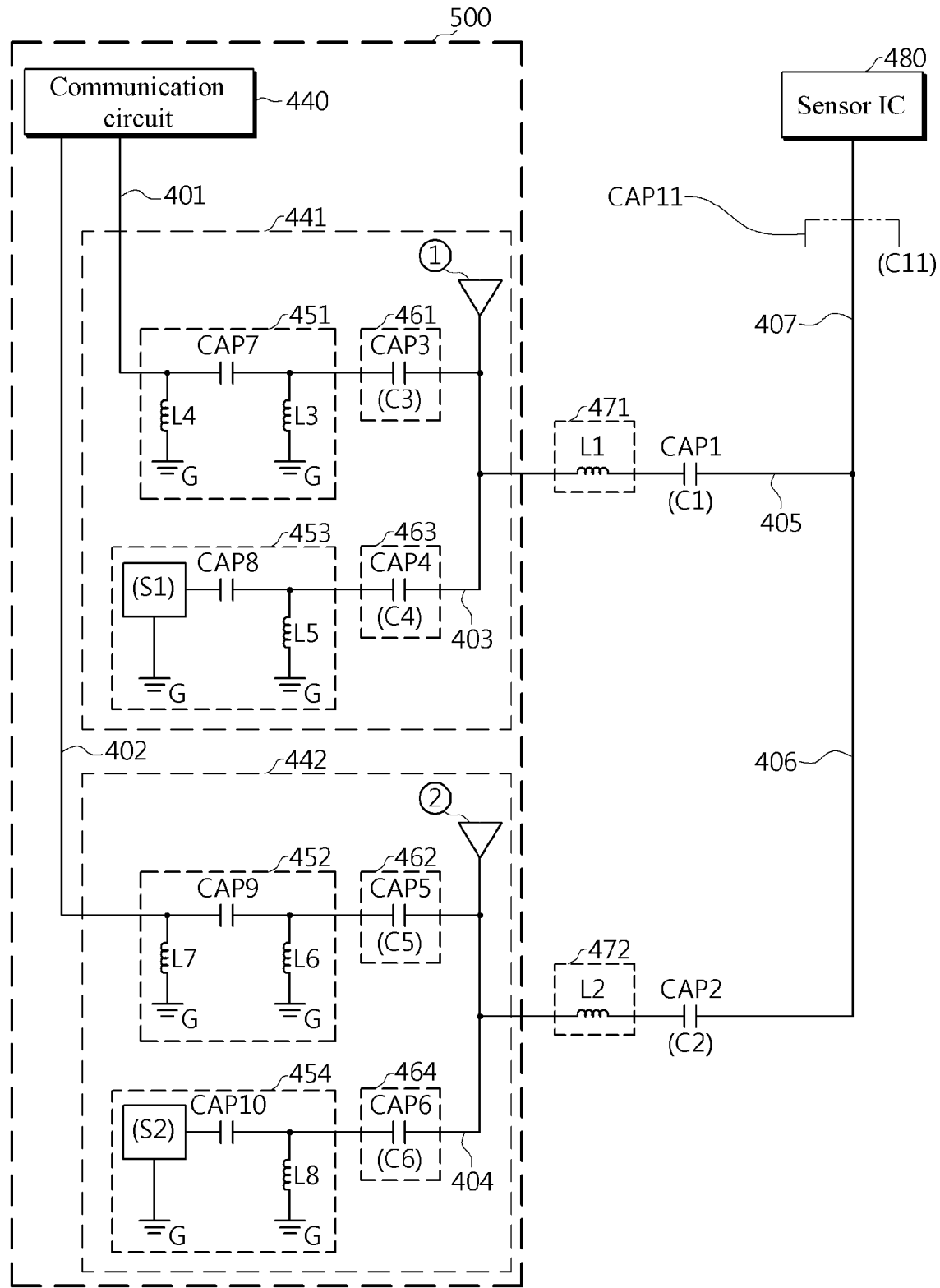
FIG. 5 illustrates a wireless communication part included in the electronic device in FIG. 4 and a sensing circuit electrically connected to the wireless communication part according to an embodiment of the disclosure.
Figure 6A:
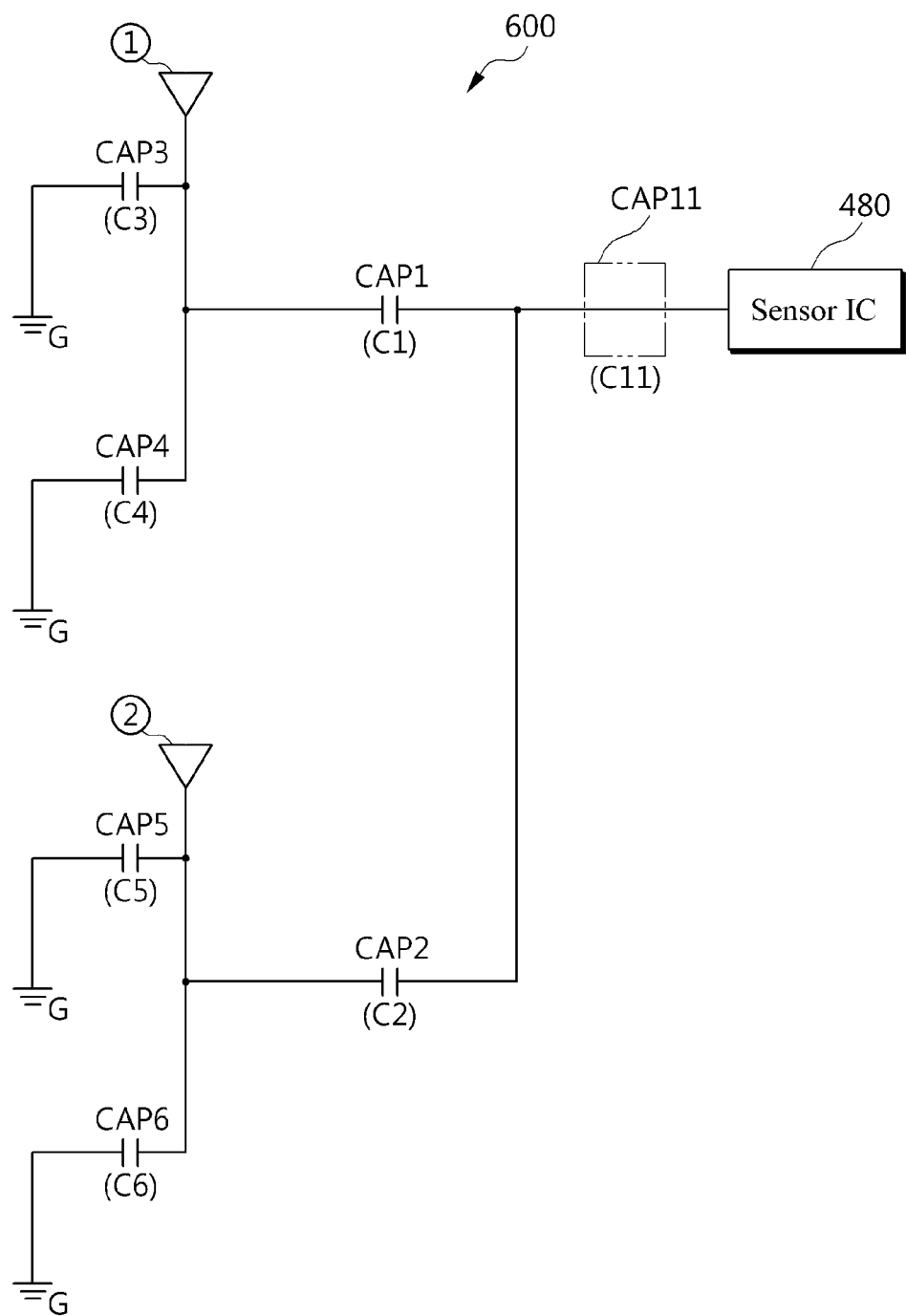
FIG. 6A illustrates a sensing circuit electrically connected to the wireless communication part in FIG. 5 according to an embodiment of the disclosure.
Figure 6B:
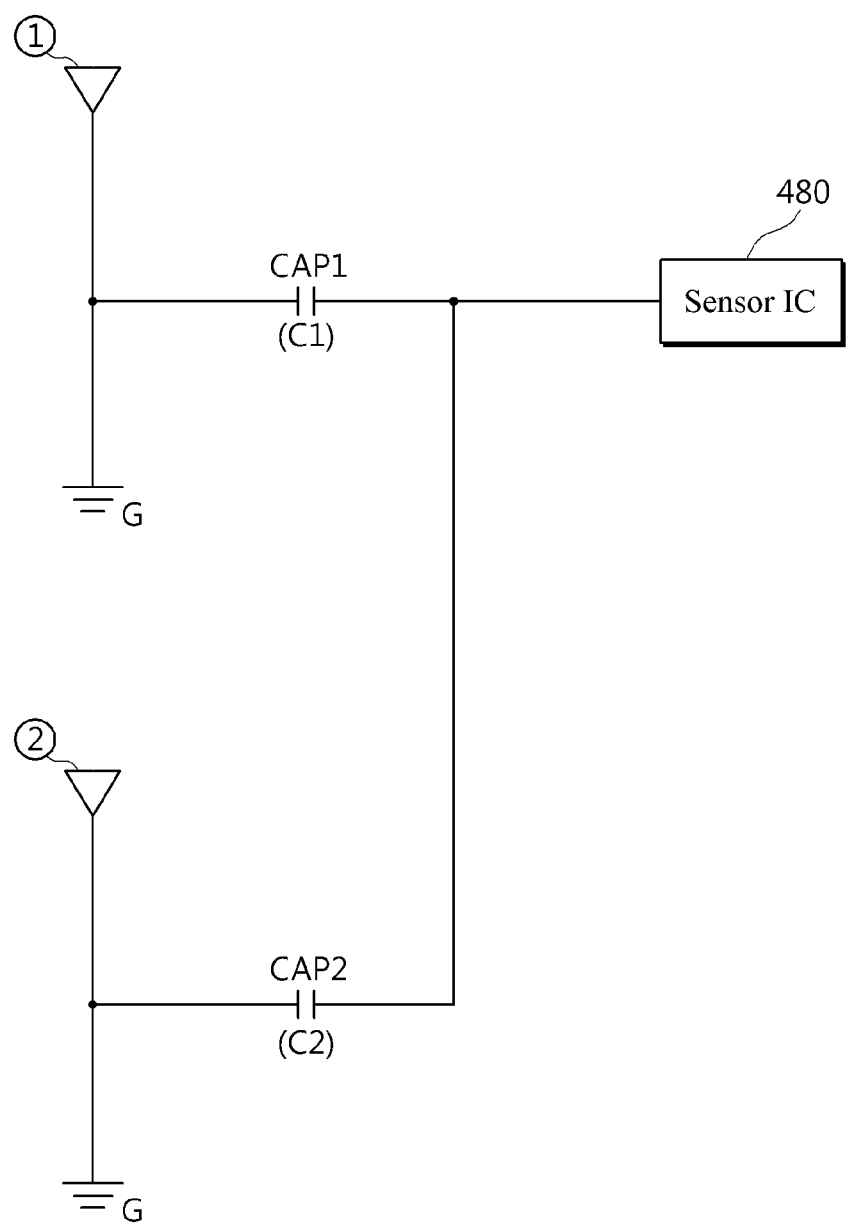
FIG. 6B illustrates a sensing circuit according to an embodiment of the disclosure.

FIG. 5 illustrates a wireless communication part included in the electronic device in FIG. 4 and a sensing circuit electrically connected to the wireless communication part according to an embodiment of the disclosure. FIG. 6A illustrates a sensing circuit electrically connected to the wireless communication part in FIG. 5 according to an embodiment of the disclosure. FIG. 6B illustrates a sensing circuit according to an embodiment of the disclosure.

Referring to FIG. 5, in an embodiment, a wireless communication part 500 may include a communication circuit 440, a first antenna 441, and a second antenna 442. The first antenna 441 may include a first antenna radiator ①, a ground G, a first matching circuit 451, a third matching circuit 453, a first protection circuit 461, or a third protection circuit 463. The second antenna 442 may include a second antenna radiator ②, a ground G, a second matching circuit 452, a fourth matching circuit 454, a second protection circuit 462, or a fourth protection circuit 464.

The first matching circuit 451 may include, for example, at least one lumped element disposed in the first electrical path 401 between the communication circuit 440 and the first antenna radiator ①. In the embodiment shown in the drawing, the first matching circuit 451 may include a seventh capacitor CAP7 connected in series to the first electrical path 401. In the embodiment shown in the drawing, the first matching circuit 451 may include a third inductor L3 disposed in series on an electrical path for connecting the ground G and one point on the first electrical path 401 between the communication circuit 440 and the seventh capacitor CAP7. In the embodiment shown in the drawing, the first matching circuit 451 may include a fourth inductor L4 disposed in series on an electrical path for connecting the ground G and another point on the first electrical path 401 between the first protection circuit 461 and the seventh capacitor CAP7. The first matching circuit 451 is not limited to the embodiment in FIG. 5 and may be realized in various different forms.

The second matching circuit 452 may include, for example, at least one lumped element disposed in the second electrical path 402 between the communication circuit 440 and the second antenna radiator ②. According to an embodiment, the second matching circuit 452 may be realized in a manner at least partially identical to the first matching circuit 451 and may include, for example, a ninth capacitor CAP9, a sixth inductor L6, or a seventh inductor L7.

The third matching circuit 453 may include, for example, at least one lumped element disposed in the third electrical path 403 between the ground G and the first antenna radiator ①. In the embodiment described above, the third matching circuit 453 may include a first switch S1 disposed in series on the third electrical path 403. In the embodiment described above, the third matching circuit 453 may include an eighth capacitor CAP8 disposed in series on the third electrical path 403 between the first switch S1 and the third protection circuit 463. In the embodiment shown in the drawing, the third matching circuit 453 may include a fifth inductor L5 disposed in series on an electrical path for connecting the ground G and one point on the first electrical path 401 between the third protection circuit 463 and the eighth capacitor CAP8. The third matching circuit 453 is not limited to the embodiment in FIG. 5 and may be realized in various different forms.

According to an embodiment, according to an on state or off state of the first switch S1 by controlling of the processor 120 in FIG. 1, a resonance frequency of the first antenna radiator ① may be moved to a predetermined frequency or by a predetermined degree. According to various embodiments, the third matching circuit 453 may reduce antenna radiation performance degradation related to the first antenna radiator ①. In case that a dielectric substance such as a user's hand approaches the first antenna radiator ①, the dielectric substance may affect frequency transmission/reception performance (e.g., antenna radiation performance) of the first antenna radiator ①. For example, impedance mismatching may occur due to a characteristic impedance of a hand which grips the electronic device 200. For another example, the hand which grips the electronic device 200 may change a capacitance related to the first antenna radiator ① to cause impedance mismatching. The third matching circuit 453 may reduce the impedance mismatching. For example, in case that a dielectric substance such as the user's hand approaches the first antenna radiator ① (e.g., the first grip state), the first switch S1 is turned on and thus an effect of the dielectric substance to antenna radiation performance of the first antenna radiator ① may be reduced.

The fourth matching circuit 454 may include, for example, at least one lumped element disposed in the fourth electrical path 404 between the ground G and the second antenna radiator ②. According to an embodiment, the fourth matching circuit 454 may be realized in a manner at least partially identical to the second matching circuit 452 and may include, for example, a second switch S2, a tenth capacitor CAP10, or an eighth inductor L8.

According to an embodiment, according to an on state or off state of the second switch S2 by controlling of the processor 120 in FIG. 1, a resonance frequency of the second antenna radiator ② may be moved to a predetermined frequency or by a predetermined degree. According to various embodiments, the fourth matching circuit 454 may reduce antenna radiation performance degradation related to the second antenna radiator ②. In case that a dielectric substance such as a user's hand approaches the second antenna radiator ②, the dielectric substance may affect frequency transmission/reception performance (e.g., antenna radiation performance) of the second antenna radiator ②. For example, impedance mismatching may occur due to a characteristic impedance of a hand which grips the electronic device 200. For another example, the hand which grips the electronic device 200 may change a capacitance related to the second antenna radiator ② to cause impedance mismatching. The fourth matching circuit 454 may reduce the impedance mismatching. For example, in case that a dielectric substance such as the user's hand approaches the second antenna radiator ② (e.g., the second grip state), the second switch S2 is turned on and thus an effect of the dielectric substance to antenna radiation performance of the second antenna radiator ② may be reduced.

According to an embodiment, the program 140 in FIG. 1 may include instructions to cause the processor 120 in FIG. 1 to enter a frequency adjustment mode while performing communication (e.g., calling) with an external device through the communication circuit 440 (e.g., the wireless communication module 192 in FIG. 1). For example, the program 140 in FIG. 1 may include instructions to cause the processor 120 in FIG. 1 to control the first switch S1 and/or the second switch S2 in the frequency adjustment mode in case that a grip state (e.g., the first grip state or the second grip state) is identified by using the sensor IC 480. According to various embodiments, like the third matching circuit 453 or the fourth matching circuit 454, the first matching circuit 451 and/or the second matching circuit 452 may be realized to be controlled based on a capacitance measured by the sensor IC 480.

The first protection circuit 461 may include a varistor and may include, for example, a third capacitor CAP3 disposed in series on the first electrical path 401 between the first matching circuit 451 and the first antenna radiator ①.

The second protection circuit 462 may include a varistor and may include, for example, a fifth capacitor CAP5 disposed in series on the second electrical path 402 between the second matching circuit 452 and the second antenna radiator ②.

The third protection circuit 463 may include a varistor and may include, for example, a fourth capacitor CAP4 disposed in series on the third electrical path 403 between the third matching circuit 453 and the first antenna radiator ①.

The fourth protection circuit 464 may include a varistor and may include, for example, a sixth capacitor CAP6 disposed in series on the fourth electrical path 404 between the fourth matching circuit 454 and the second antenna radiator ②.

According to an embodiment, the first band stop filter 471 may include an inductor (e.g., first inductor L1) disposed in series on the fifth electrical path 405 between the first antenna 441 and the sensor IC 480.

According to an embodiment, the second band stop filter 472 may include a second inductor L2 disposed in series on the sixth electrical path 406 between the second antenna 442 and the sensor IC 480.

Referring to FIG. 6A, in an embodiment, a sensing circuit 600 may include a sensor IC 480, a first antenna radiator ①, a second antenna radiator ②, a first capacitor CAP1, a second capacitor CAP2, a third capacitor CAP3, a fourth capacitor CAP4, a fifth capacitor CAP5, a sixth capacitor CAP6, and/or a ground G. The sensing circuit 600 may operate in a frequency band lower than, for example, that of the wireless communication part 500 in FIG. 5.

Equation 1 below relates to the total capacitance measured by the sensor IC 480 in a non-grip state.

$$\text{Total Capacitance} = C_{free\,1} + C_{free\,2} \qquad \text{Equation 1}$$

$$C_{free\,1} = \frac{1}{\frac{1}{C1} + \frac{1}{C3 + C4 + \text{Parastic } C1}}$$

$$C_{free\,2} = \frac{1}{\frac{1}{C2} + \frac{1}{C5 + C6 + \text{Parastic } C2}}$$

$C_{free1}$ indicates a capacitance measured through the fifth electrical path 405 when not in the first grip state. $C_{free2}$ indicates a capacitance measured through the sixth electrical path 406 when not in the second grip state. C1 may be a first capacitance of the first capacitor CAP1. C2 may be a second capacitance of the second capacitor CAP2. C3 may be a third capacitance of the third capacitor CAP3. C4 may be a fourth capacitance of the fourth capacitor CAP4. C5 may be a fifth capacitance of the fifth capacitor CAP5. C6 may be a sixth capacitance of the sixth capacitor CAP6. Parasitic C1 may be a first parasitic capacitance by a parasitic component, which is caused between the first antenna 441 and a component (e.g., the display 201 in FIG. 2A) around the first antenna 441. Parasitic C2 may be a second parasitic capacitance by a parasitic component, which is caused between the second antenna 442 and a component (e.g., the display 201 in FIG. 2A) around the second antenna 442.

Equation 2 below shows a capacitance $C_{1st\ Grip}$ measured through the fifth electrical path 405 in the first grip state. For example, the first grip state may include a state in which a dielectric substance approaches or contacts the first antenna 441. For example, Hand C1 may indicate a capacitance generated by a dielectric substance in the first grip state. The dielectric substance may include, for example, a right hand which is a part of a human body and may cause electrical field change or voltage drop.

$$C_{1st\ Grip} = \frac{1}{\frac{1}{C1} + \frac{1}{C3 + C4 + Parastic\ C1 + Hand\ C1}} \quad \text{Equation 2}$$

Equation 3 below shows a capacitance $C_{2nd\ Grip}$ measured through the sixth electrical path 406 in the second grip state. For example, the second grip state may include a state in which a dielectric substance approaches or contacts the second antenna 442. For example, Hand C2 may indicate a capacitance generated by a dielectric substance in the second grip state. The dielectric substance may include, for example, a left hand which is a part of a human body and may cause electrical field change or voltage drop.

$$C_{2nd\ Grip} = \frac{1}{\frac{1}{C2} + \frac{1}{C5 + C6 + Parastic\ C2 + Hand\ C2}} \quad \text{Equation 3}$$

Equation 4 below shows the total capacitance Total Capacitance $_{1st\ Grip}$ measured through the sensor IC 480 in the first grip state.

$$\text{Total Capacitance}_{1st\ Grip} = \frac{1}{\frac{1}{C1} + \frac{1}{C3 + C4 + Parastic\ C1 + Hand\ C1}} + \frac{1}{\frac{1}{C2} + \frac{1}{C5 + C6 + Parastic\ C2}} \quad \text{Equation 4}$$

$$\text{Total Capacitance}_{1st\ Grip} = C1 + \frac{1}{\frac{1}{C2} + \frac{1}{C5 + C6 + Parastic\ C2}}$$

An electric field generated by the first antenna radiator ① in the first grip state may be changed due to a capacitance Hand C1 formed by a dielectric substance. For example, due to a capacitance Hand C1 generated when a dielectric substance grips the first antenna 441, a capacitance of the first antenna 441 measured by the sensor IC 480 may reach the first capacitance C1 of the first capacitor CAP1. For example, the capacitance Hand C1 may have a value such that a value of 1/(C3+C4+ParasticC1+HandC1) converges to zero. The total capacitance Total Capacitance $_{1st\ Grip}$ measured by the sensor IC 480 in the first grip state may be determined by a capacitance $C_{free2}$ in a state in which there is no grip on the second antenna 442 and a first capacitance C1 of the first capacitor CAP1.

Equation 5 below shows the total capacitance Total Capacitance $_{2nd\ Grip}$ measured through the sensor IC 480 in the second grip state.

$$\text{Total Capacitance}_{2nd\ Grip} = \frac{1}{\frac{1}{C1} + \frac{1}{C3 + C4 + Parastic\ C1}} + \frac{1}{\frac{1}{C2} + \frac{1}{C5 + C6 + Parastic\ C2 + Hand\ C2}} \quad \text{Equation 5}$$

$$\text{Total Capacitance}_{2nd\ Grip} = \frac{1}{\frac{1}{C1} + \frac{1}{C3 + C4 + Parastic\ C1}} + C2$$

An electric field generated by the second antenna radiator ② in the second grip state may be changed due to a capacitance Hand C2 formed by a dielectric substance. For example, due to a capacitance Hand C2 generated when a dielectric substance grips the second antenna 442, a capacitance of the second antenna 442 measured by the sensor IC 480 may reach the second capacitance C2 of the second capacitor CAP2. For example, the capacitance Hand C2 may have a value such that a value of 1/(C5+C6+ParasticC2+HandC2) converges to zero. The total capacitance Total Capacitance $_{2nd\ Grip}$ measured by the sensor IC 480 in the second grip state may be determined by a capacitance $C_{free1}$ in a state in which there is no grip on the first antenna 441 and a second capacitance C2 of the second capacitor CAP2.

In an embodiment, referring to Equation 4 and Equation 5, the total capacitance Total Capacitance $_{1st\ Grip}$ measured by the sensor IC 480 in the first grip state and the total capacitance Total Capacitance $_{2nd\ Grip}$ measured by the sensor IC 480 in the second grip state may be different. A difference between the total capacitance Total Capacitance $_{1st\ Grip}$ measured by the sensor IC 480 in the first grip state and the total capacitance Total Capacitance $_{2nd\ Grip}$ measured by the sensor IC 480 in the second grip state may make it possible to determine the first grip state and the second grip state. As for the first grip state, a measurement range of the total capacitance Total Capacitance $_{1st\ Grip}$ measured by the sensor IC 480 may be formed by the first capacitance C1. As for the second grip state, a measurement range of the total capacitance Total Capacitance $_{2nd\ Grip}$ measured by the sensor IC 480 may be formed by the second capacitance C2. According to various embodiments, in case that the total capacitance measured by the sensor IC 480 reaches a sum of the first capacitance C1 and the second capacitance C2, the electronic device 200 may be identified to be in a third grip state (e.g., in a state in which the electronic device 200 is gripped by both hands), as well. For example, the third grip state may include a state in which a dielectric substance approaches or contacts the first antenna 441 and the second antenna 442.

According to various embodiments, the first protection circuit 461 may be omitted and in this case, the third capacitance C3 may be deleted from Equation 1, Equation 2, Equation 3, Equation 4, and Equation 5. The third protection circuit 463 may be omitted and in this case, the fourth capacitance C4 may be deleted from Equation 1, Equation 2, Equation 3, Equation 4, and Equation 5. The second protection circuit 462 may be omitted and in this case, the fifth capacitance C5 may be deleted from Equation 1, Equation 3, Equation 3, Equation 4, and Equation 5. The fourth protection circuit 464 may be omitted and in this case, the sixth capacitance C6 may be deleted from Equation 1, Equation 3, Equation 3, Equation 4, and Equation 5. For example, in case that the first protection circuit 461, the second protection circuit 462, the third protection circuit 463, and the fourth protection circuit 464 are omitted, the sensing circuit for detecting the first grip state or the second grip state may correspond to the sensing circuit 601 shown in FIG. 6B.

According to an embodiment, the total capacitance Total Capacitance $_{1st\ Grip}$ measured by the sensor IC 480 in the first grip state may not be substantially affected by the third capacitance C3 of the first protection circuit 461 and/or the fourth capacitance C4 of the third protection circuit 463. The total capacitance Total Capacitance $_{2nd\ Grip}$ measured by the sensor IC 480 in the second grip state may not be substantially affected by the fifth capacitance C5 of the second protection circuit 462 and/or the sixth capacitance C6 of the fourth protection circuit 464. In this connection, the sensing circuit shown in FIG. 5, which is electrically connected to the wireless communication part 500 for practically detecting the first grip state or the second grip state may correspond to the sensing circuit 601 shown in FIG. 6B.

The first grip state and the second grip state are described as an example in order to easily explain the technical content according to an embodiment of the disclosure and to help the understanding of the embodiment of the disclosure but are not limited thereto. The location of the first antenna radiator ① or the second antenna radiator ② may be changed and the state in which a dielectric substance approaches or contacts the first antenna radiator ① or the state in which a dielectric substance approaches or contacts the second antenna radiator ② may be determined by using the first capacitor CAP1 and the second capacitor CAP2. For example, in case that capacitances of the first capacitor CAP1 and the second capacitor CAP2 are different, the electronic device 200 may determine which one of the first antenna radiator ① or the second antenna radiator ② is gripped. According to various embodiments, without limitation to the embodiment of FIG. 4, three or more antennas electrically connected to the sensor IC 480 may be provided and various locations in which a dielectric substance abuts onto the electronic device 200 may be identified by using an additional capacitor in addition to the first capacitor CAP1 or the second capacitor CAP2.

According to various embodiments, without limitation to the embodiment of FIG. 4, the first band stop filter 471 may be realized to include the first capacitor CAP1.

According to various embodiments, without limitation to the embodiment of FIG. 4, the second band stop filter 472 may be realized to include the second capacitor CAP2.

According to an embodiment, the electronic device 200 may include a seventh electrical path 407 electrically connected to the fifth electrical path 405 and the sixth electrical path 406. The sensor IC 480 may be electrically connected to the fifth electrical path 405 through the seventh electrical path 407. The sensor IC 480 may be electrically connected to the sixth electrical path 406 through the seventh electrical path 407. The fifth electrical path 405 may be referred to as a first branch line which is branched from the seventh electrical path 407 and the sixth electrical path 406 may be referred to as a second branch line which is branched from the seventh electrical path 407. According to some embodiments, the seventh electrical path 407 may be a part of the fifth electrical path 405 and the sixth electrical path 406 may be referred to as an electrical path extending from one point on the fifth electrical path 405 between the sensor IC 480 and the first capacitor CAP1. According to some embodiments, the seventh electrical path 407 may be a part of the sixth electrical path 406 and the fifth electrical path 405 may be referred to as an electrical path extending from one point on the sixth electrical path 406 between the sensor IC 480 and the second capacitor CAP2.

In various embodiments, referring to FIGS. 4, 5, 6A, and 6B, the first capacitor CAP1 and the second capacitor CAP2 may be omitted and an eleventh capacitor CAP11 may be connected in series to the seventh electrical path 407. In this case, Equation 6 below shows the total capacitance Total Capacitance $_{Grip}$ measured by the sensor IC 480 in a grip state.

$$\text{Total Capacitance}_{Grip} = \cfrac{1}{\cfrac{1}{C11} + \cfrac{1}{C3 + C4 + Parastic\ C1 + C5 + C6 + Parastic\ C2 + \text{Hand } C}} \quad \text{Equation 6}$$

C11 may be an eleventh capacitance of the eleventh capacitor CAP11. Hand C may indicate a capacitance generated by a dielectric substance on the electronic device 200. For example, the dielectric substance may include a hand. Due to the capacitance Hand C generated by a dielectric substance, the total capacitance Total Capacitance $_{Grip}$ measured by the sensor IC 480 may substantially reach the eleventh capacitance C11. For example, in case that a dielectric substance approaches or contacts the first antenna 441 or the second antenna 442, the capacitance Hand C may have a value of 1/(C3+C4+Parastic C1+C5+C6+Parastic C2+Hand C) converging to zero. In case that the eleventh capacitance C11 is detected, a grip state may be identified. In the embodiment in which the first capacitor CAP1 and the second capacitor CAP2 area omitted and the eleventh capacitor CAP11 is connected in series to the seventh electrical path 407, it may be difficult to determine the first grip state or the second grip state compared to the embodiment of FIGS. 4, 5, 6A, or 6B.

According to various embodiments, in the embodiments of FIGS. 4, 5, 6A, or 6B, the larger a difference between the first capacitance C1 and the second capacitance C2 is, the larger a difference between the total capacitance Total Capacitance $_{1st\ Grip}$ measured by the sensor IC 480 in the first grip state and the total capacitance Total Capacitance $_{2nd\ Grip}$ measured by the sensor IC 480 in the second grip state is, and thus it may be easy to determine which grip state the electronic device is in. For example, the first grip state may correspond to a right-hand grip state and the second grip state may correspond to a left-hand grip state. For another example, the first grip state may correspond to a left-hand grip state and the second grip state may correspond to a right-hand grip state.

According to various embodiments, as the first capacitance C1 is larger than the second capacitance C2, sensing sensitivity (e.g., a sensitivity degree for identifying proximity of a dielectric substance through the first antenna radiator ①) through the first antenna radiator ① may be degraded. According to various embodiments, as the second capacitance C2 is larger than the first capacitance C1, sensing sensitivity (e.g., a sensitivity degree for identifying proximity of a dielectric substance through the second antenna radiator ②) through the second antenna radiator ② may be degraded.

For example, Table 1 below shows sensing sensitivity, the total capacitance when in a non-grip state, and the total capacitance when in a grip in consideration of a capacitance (e.g., about 200 pF) and a parasitic capacitance (e.g., about 150 pF) of the wireless communication part 500 for various embodiments to which the first capacitance C1 and the second capacitance C2 at various values within an allowable capacitance of the sensor IC 480 are distributed. For example, the first grip state may be a state in which the first antenna 441 is gripped and the second grip state may be a state in which the second antenna 442 is gripped.

$$\frac{\Delta \text{Total Capacitance}}{\text{Hand } C} = \frac{(C_{free\,1} + C_{free\,2}) - \text{Total Capacitance}_{Grip}}{\text{Hand } C} \quad \text{Equation 7}$$

The first capacitance C1 and the second capacitance C2 may be distribute so that a difference between the total capacitance Total Capacitance $_{1st\,Grip}$ in the first grip state (see Equation 4 above) and the total capacitance Total Capacitance $_{2nd\,Grip}$ in the second grip state (see Equation 5 above) may reach a securing level for determining a grip state while securing sensing sensitivity.

Figure 7:
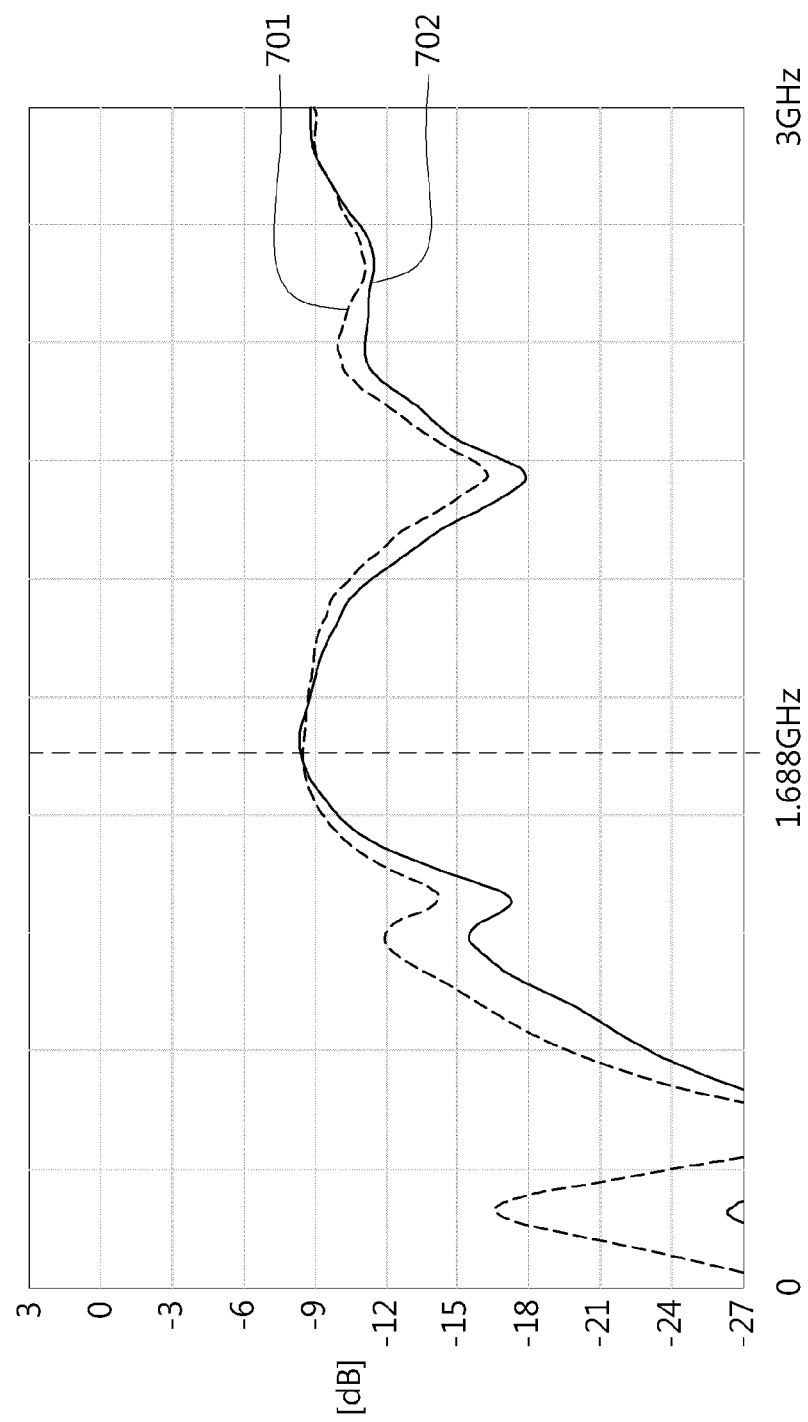
FIG. 7 is a graph showing antenna radiation performance related to the wireless communication part in FIG. 5 according to an embodiment of the disclosure.

FIG. 7 is a graph showing antenna radiation performance related to the wireless communication part in FIG. 5 according to an embodiment of the disclosure.

TABLE 1

| Allowable capacitance Of the sensor IC 480 [pF] | C1 and C2 [pF] | | Capacitance Of the wireless communication part 500 [pF] | Parasitic capacitance [pF] | Sensing sensitivity | Total capacitance when in a non-grip state [pF] | Total capacitance When in a grip state [pF] First grip state |
|---|---|---|---|---|---|---|---|
| 100 | C1 | 70 | 200 | 150 | 3.2% | 86 | 92 |
|  | C2 | 30 |  |  |  |  |  |
|  | C1 | 60 | 200 | 150 | 3.0% | 87 | 91 |
|  | C2 | 40 |  |  |  |  |  |
| 120 | C1 | 80 | 200 | 150 | 4.4% | 101 | 108 |
|  | C2 | 40 |  |  |  |  |  |
| 130 | C1 | 80 | 200 | 150 | 4.8% | 108 | 116 |
|  | C2 | 50 |  |  |  |  |  |

Referring to Table 1 above, in the first embodiment, in case that the allowable capacitance of the sensor IC 480 is formed to be 100 pF, the first capacitance C1 to be about 70 pF, and the second capacitance C2 to about 30 pF, the total capacitance (about 92 pF) in the first grip state and the total capacitance (about 87 pF) in the second grip state may have a difference of about 5 pF. In the second embodiment, in case that the allowable capacitance of the sensor IC 480 is formed to be 100 pF, the first capacitance C1 to be about 60 pF, and the second capacitance C2 to about 40 pF, the total capacitance (about 91 pF) in the first grip state and the total capacitance (about 89 pF) in the second grip state may have a difference of about 2 pF. In the third embodiment, in case that the allowable capacitance of the sensor IC 480 is formed to be 120 pF, the first capacitance C1 to be about 80 pF, and the second capacitance C2 to about 40 pF, the total capacitance (about 108 pF) in the first grip state and the total capacitance (about 103 pF) in the second grip state may have a difference of about 5 pF. In the fourth embodiment, in case that the allowable capacitance of the sensor IC 480 is formed to be 130 pF, the first capacitance C1 to be about 80 pF, and the second capacitance C2 to about 50 pF, the total capacitance (about 116 pF) in the first grip state and the total capacitance (about 112 pF) in the second grip state may have a difference of about 4 pF. Referring to Equation 7 below, the sensing sensitivity may indicate a ratio of a difference value ΔTotal Capacitance of the total capacitance (e.g., a sum of $C_{free1}$ and $C_{free2}$ based on Equation 1 above) in a non-grip state and the total capacitance Total Capacitance $_{Grip}$ in a grip state with respect to the capacitance Hand C (e.g., Hand C1 in Equation 2 above, or Hand C2 in Equation 3 above) formed by a dielectric substance (e.g., a hand).

Referring to FIG. 7, for example, reference numeral '701' denotes antenna radiation performance with respect to the wireless communication part 500 in a first case in which the sensing circuit 600 in FIG. 6A (or the sensing circuit 601 in FIG. 6B) is omitted. Reference numeral '702' denotes antenna radiation performance with respect to the wireless communication part 500 in a second case in which the sensing circuit 600 in FIG. 6A is realized. According to an embodiment, in the first case, the antenna radiation performance with respect to the wireless communication part 500 may have antenna radiation performance of about −8.5 dB in a used frequency band (e.g., about 1.688 GHz). In the second case, the antenna radiation performance with respect to the wireless communication part 500 may have antenna radiation performance of about −8.45 dB thereby corresponding to a level of securing antenna radiation performance. Referring to FIG. 4, in case that the communication circuit 440 transmits and/or receives a first frequency signal (e.g., a first RF signal) in a first frequency band through the first antenna 441, the first band stop filter 471 may substantially prevent the first frequency signal from being transferred to the sensor IC 480 through the fifth electrical path 405. As such, loss of the first frequency signal may be reduced and antenna radiation performance with respect to the first antenna 441 may be secured. In case that the communication circuit 440 transmits and/or receives a second frequency signal (e.g., a second RF signal) in a second frequency band through the second antenna 442, the second band stop filter 472 may substantially prevent the second frequency signal from being transferred to the sensor IC 480 through the sixth electrical path 406. As such, loss of the second frequency signal may be reduced and antenna radiation performance with respect to the second antenna 442 may be secured. According to an embodiment, the first band stop filter 471 and the second band stop filter 472 may include an inductor having an inductance of about 200 nH.

Figure 8:
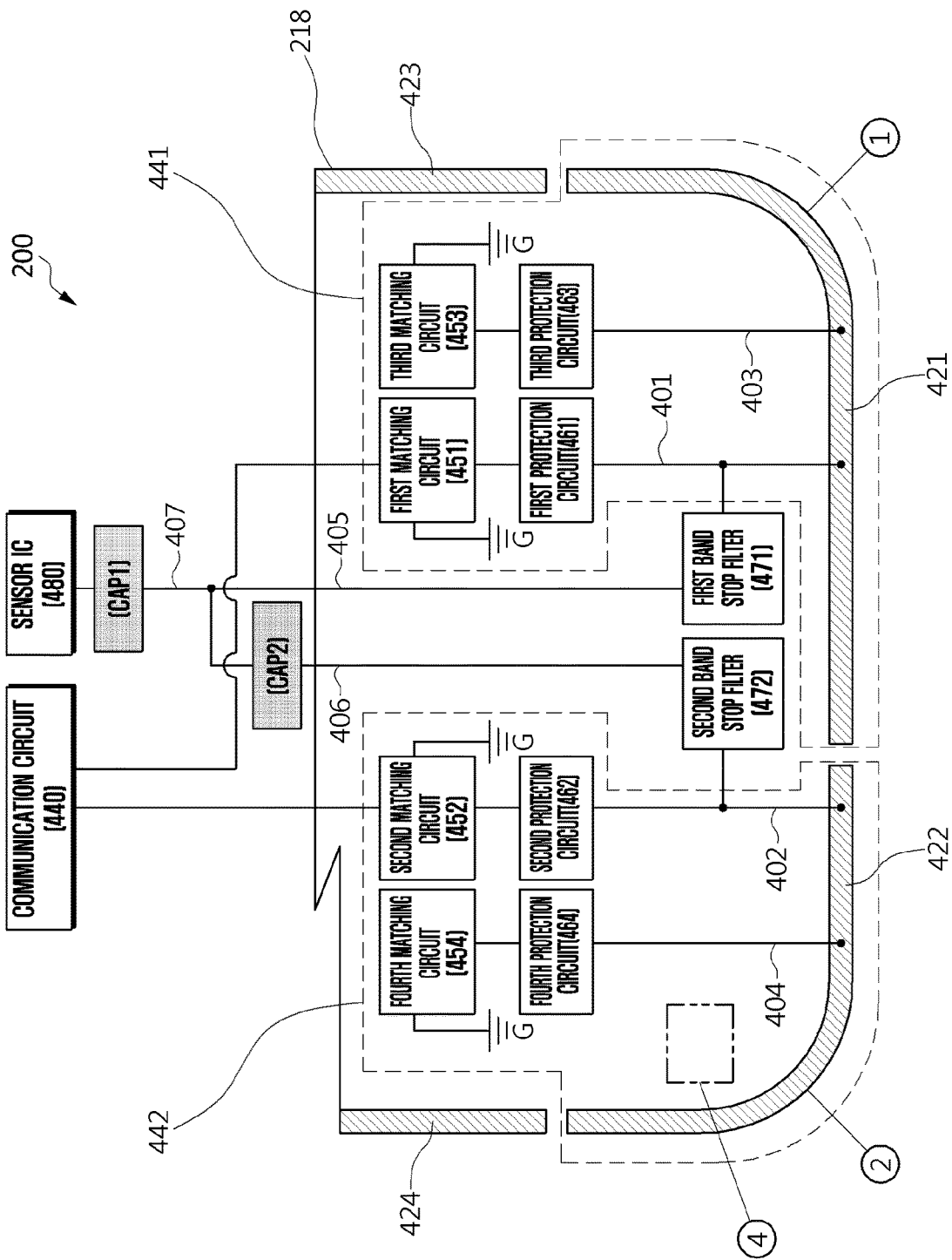
FIG. 8 is a block diagram related to the electronic device in FIG. 2A according to an embodiment of the disclosure.

FIG. 8 is a block diagram related to the electronic device in FIG. 2A according to an embodiment of the disclosure.

Referring to FIG. 8, in an embodiment, an electronic device 200 may include a first antenna 441, a second antenna 442, a communication circuit 440 and a sensor IC 480. The first antenna 441 and the second antenna 442 may be electrically connected to the communication circuit 440 (e.g., the communication module 192 in FIG. 1). The sensor IC 480 may be electrically connected to the first antenna 441 and the second antenna 442. In an embodiment, the first antenna 441 may include a first antenna radiator ①, a ground (or an antenna ground) G, a first electrical path 401, a third electrical path 403, a first matching circuit 451, a third matching circuit 453, a first protection circuit 461, or a third protection circuit 463. In an embodiment, the second antenna 442 may include a second antenna radiator ②, a ground (or an antenna ground) G, a second electrical path 402, a fourth electrical path 404, a second matching circuit 452, a fourth matching circuit 454, a second protection circuit 462, or a fourth protection circuit 464. The electronic device 200 may include a fifth electrical path 405, a sixth electrical path 406, a first band stop filter 471, or a second band stop filter 472. An overlapping description with respect to a portion of reference numerals of FIG. 8 will be omitted.

According to an embodiment, the electronic device 200 may include a first capacitor CAP1 disposed in series on the seventh electrical path 407. According to an embodiment, the electronic device 200 may include a second capacitor CAP2 disposed in series on the sixth electrical path 406 between the second band stop filter 472 and the sensor IC 480. For example, the first grip state may include a state in which a dielectric substance approaches or contacts the first antenna 441. For example, the second grip state may include a state in which a dielectric substance approaches or contacts the second antenna 442.

According to an embodiment, a magnetic field generated by the first antenna radiator ① in the first grip state may be changed by a capacitance generated by a dielectric substance (e.g., the right hand). For example, due to a capacitance generated when a dielectric substance grips the first antenna 441, a capacitance of the first antenna 441 measured by the sensor IC 480 may reach the first capacitance C1 of the first capacitor CAP1. For example, the capacitance Hand C1 may have a value such that a value of 1/(C3+C4+ParasticC1+ HandC1) converges to zero. The total capacitance measured by the sensor IC 480 in the first grip state may be determined by a capacitance $C_{free2}$ in a state in which there is no grip on the second antenna 442 and a first capacitance C1 of the first capacitor CAP1.

According to an embodiment, a magnetic field generated by the second antenna radiator ② in the second grip state may be changed by a capacitance generated by a dielectric substance (e.g., the left hand). For example, due to a capacitance generated when a dielectric substance grips the second antenna 442, a capacitance of the second antenna 442 measured by the sensor IC 480 may substantially reach a third capacitance which is a sum of the first capacitance of the first capacitor CAP1 and the second capacitance of the second capacitor CAP2. The total capacitance measured by the sensor IC 480 in the second grip state may be determined by a capacitance $C_{free1}$ in a state in which there is no grip on the first antenna 441 and the third capacitance.

In the embodiment of FIG. 8, even in case that the first capacitance of the first capacitor CAP1 and the second capacitance of the second capacitor CAP2 are the same, the total capacitance measured by the sensor IC 480 in the first grip state and the total capacitance measured by the sensor IC 480 in the second grip state may have a difference therebetween. The difference between the total capacitance measured in the first grip state and the total capacitance measured in the second grip state may make it possible to determine the first grip state and the second grip state.

According to various embodiments, instead of the first antenna radiator ①, a third antenna radiator ③ located in the internal space of the electronic device 200 may be implemented. According to various embodiments, instead of the second antenna radiator ②, the fourth antenna radiator ④ located in the internal space of the electronic device 200 may be implemented.

Figure 9:
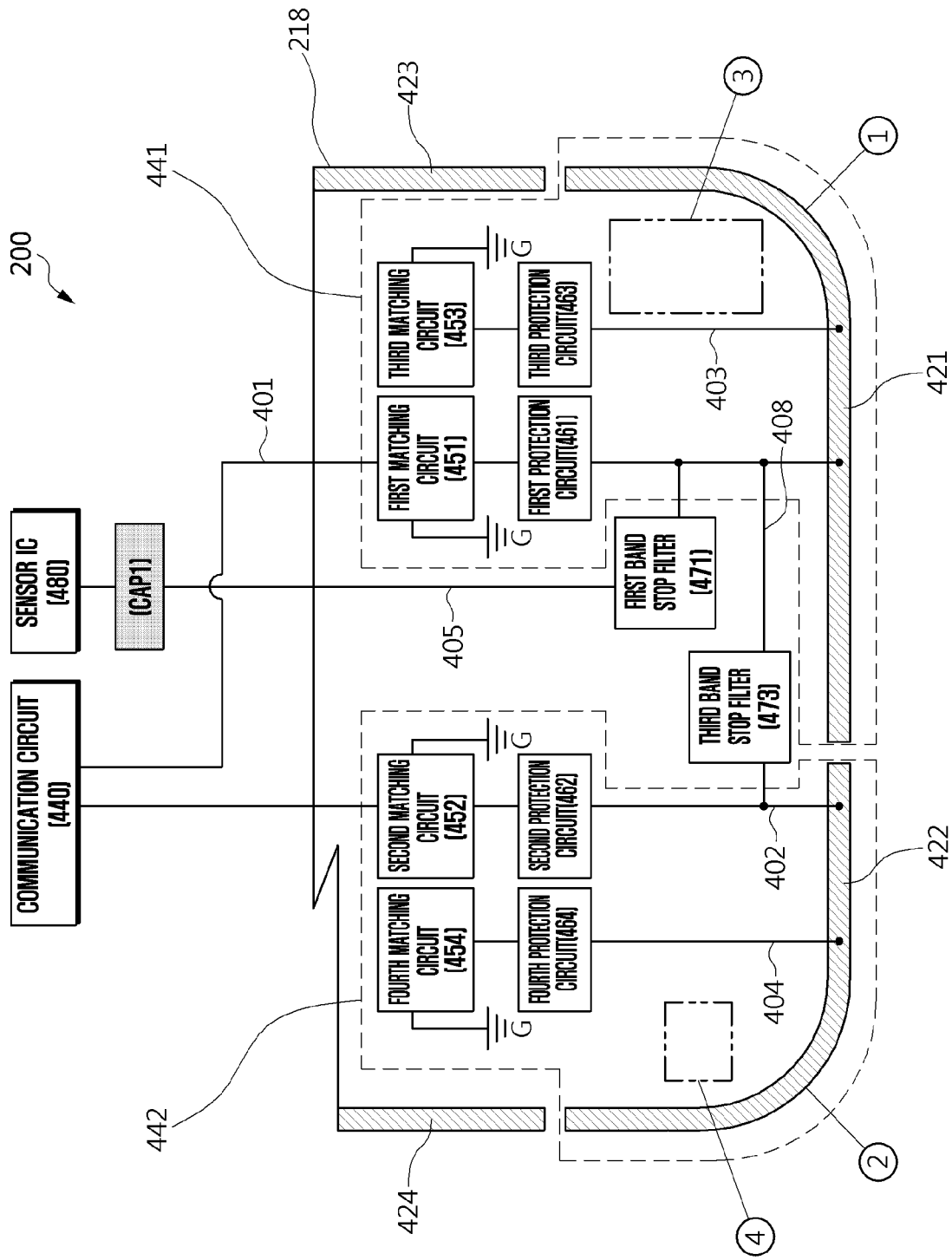
FIG. 9 is a block diagram related to the electronic device in FIG. 2A according to an embodiment of the disclosure.

FIG. 9 is a block diagram related to the electronic device in FIG. 2A according to an embodiment of the disclosure.

Referring to FIG. 9, in an embodiment, an electronic device 200 may include a first antenna 441, a second antenna 442, a communication circuit 440, and a sensor IC 480. The first antenna 441 and the second antenna 442 may be electrically connected to the communication circuit 440 (e.g., the wireless communication module 192 in FIG. 1). The sensor IC 480 may be electrically connected to the first antenna 441 and the second antenna 442. The first antenna 441 may include a first antenna radiator ①, a ground (or an antenna ground) G, a first electrical path 401, a third electrical path 403, a first matching circuit 451, a third matching circuit 453, a first protection circuit 461, or a third protection circuit 463. The second antenna 442 may include a second antenna radiator ②, a ground (or an antenna ground) G, a second electrical path 402, a fourth electrical path 404, a second matching circuit 452, a fourth matching circuit 454, a second protection circuit 462, or a fourth protection circuit 464.

According to an embodiment, the electronic device 200 may include the fifth electrical path 405 between the sensor IC 480 and the first antenna 441 and the first band stop filter 471 disposed in the fifth electrical path 405. The first band stop filter 471 may separate a frequency band utilized by the first antenna 441 and a frequency band utilized by the sensor IC 480 and thus may reduce interference therebetween to secure antenna radiation performance of the first antenna 441 and sensing performance of the sensor IC 480. For example, in case that the communication circuit 440 transmits and/or receives a first frequency signal (e.g., a first RF signal) in a first frequency band through the first antenna 441, the first band stop filter 471 may substantially prevent the first frequency signal from being transferred to the sensor IC 480 through the fifth electrical path 405. According to an embodiment, the first band stop filter 471 may include an inductor connected in series to the fifth electrical path 405 and may be realized in a circuit including various lumped elements without limitation thereto.

According to an embodiment, the electronic device 200 may include an eighth electrical path 408 between the first electrical path 401 and the second antenna 442. The eighth electrical path 408 may electrically connect the first antenna 441 and the second antenna 442. According to an embodiment, the eighth electrical path 408 may be formed between paths close to each other among paths included in the first antenna 441 and paths included in the second antenna 442. The eighth electrical path 408 may connect one point on the first electrical path 401 between the first antenna radiator ① and the first protection circuit 461 and one point on the second electrical path 402 between the second antenna radiator ② and the second protection circuit 462. The electronic device 200 may include a third band stop filter 473 disposed in the eighth electrical path 408. The third band stop filter 473 may separate a frequency band utilized by the first antenna 441 and a frequency band utilized by the second antenna 442 and thus may reduce interference therebetween to secure antenna radiation performance of the first antenna 441 and antenna radiation performance of the second antenna 442. According to an embodiment, the third band stop filter 473 may include an inductor disposed in series on the eighth electrical path 408 and may be realized in a circuit including various lumped elements without limitation thereto.

According to an embodiment, the electronic device 200 may include a first capacitor CAP1 connected in series to the fifth electrical path 405 between the sensor IC 480 and the first band stop filter 471. A magnetic field generated by the first antenna radiator ① in the first grip state may be changed by a capacitance generated by a dielectric substance (e.g., the right hand). A magnetic field generated by the second antenna radiator ② in the second grip state may be changed by a capacitance generated by a dielectric substance (e.g., the left hand). Due to the capacitance generated by a dielectric substance (e.g., a hand) in the first grip state or the second grip state, the total capacitance measured by the sensor IC 480 may substantially reach the first capacitance of the first capacitor CAP1. In case that the first capacitance is detected, a grip state may be identified. In case that the first capacitance is detected, the electronic device 200 may identify that a dielectric substance contacts or approaches the first antenna 441 or the second antenna 442, but may not identify whether it is the first grip state or the second grip state.

According to various embodiments, instead of the first antenna radiator ①, a third antenna radiator ③ located in the internal space of the electronic device 200 may be implemented. According to various embodiments, instead of the second antenna radiator ②, a fourth antenna radiator ④ located in the internal space of the electronic device 200 may be implemented.

According to various embodiments (not shown), the electronic device 200 may further include an electrical path configured to connect one point on the fifth electrical path 405 and one point on a ground path electrically connected to the first antenna radiator ①. The ground path may include, for example, the third electrical path 403.

According to various embodiments (not shown), the electronic device 200 may further include an electrical path configured to connect one point on the fifth electrical path 405 and one point on a ground path electrically connected to the second antenna radiator ②. The ground path may include, for example, the fourth electrical path 404.

Figure 10:
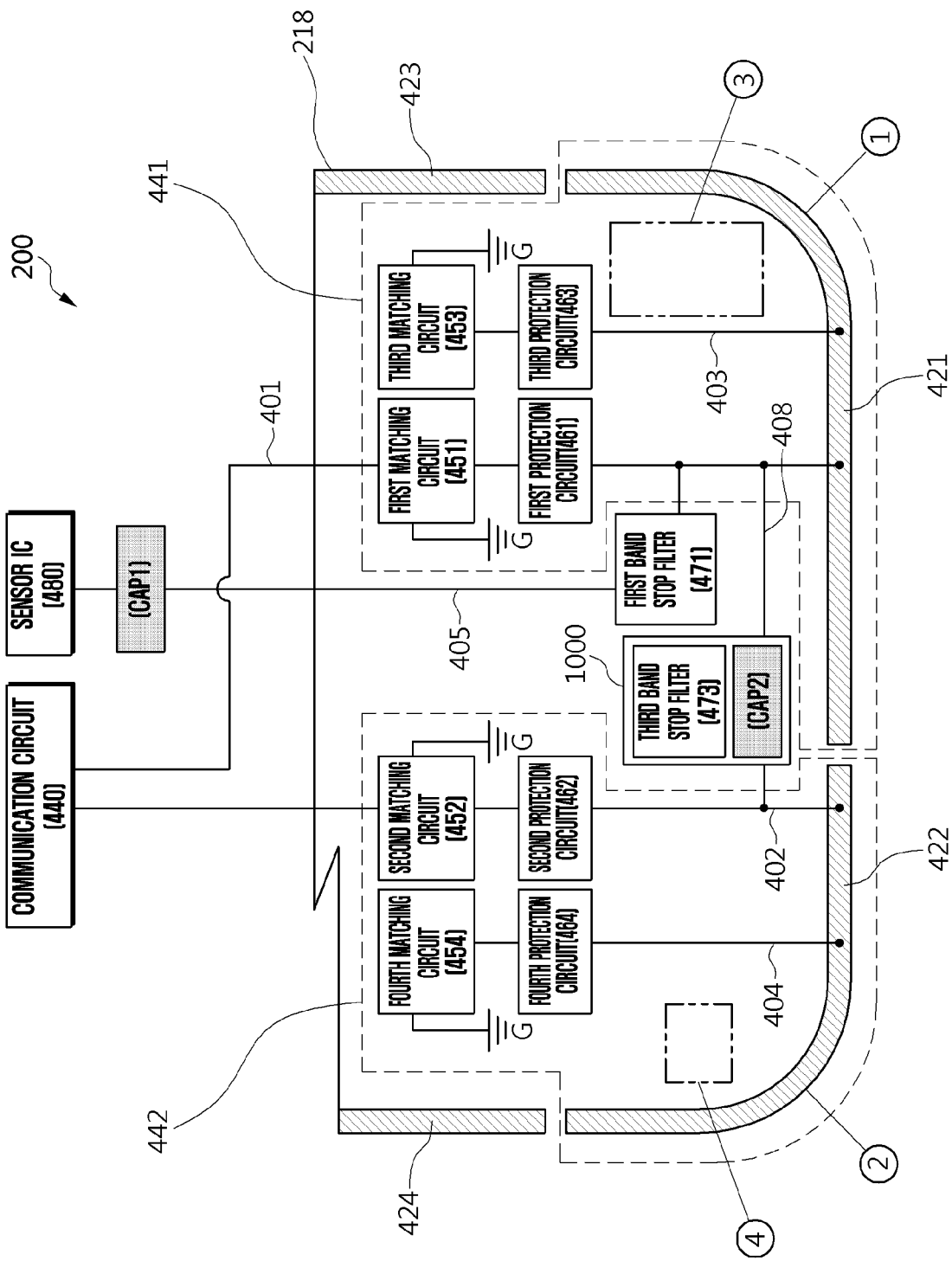
FIG. 10 is a block diagram related to the electronic device in FIG. 2A according to an embodiment of the disclosure.

FIG. 10 is a block diagram related to the electronic device in FIG. 2A according to an embodiment of the disclosure.

Referring to FIG. 10, in an embodiment, an electronic device 200 may include a first antenna 441, a second antenna 442, a communication circuit 440 and a sensor IC 480. The first antenna 441 and the second antenna 442 may be electrically connected to the communication circuit 440 (e.g., the wireless communication module 192 in FIG. 1). The sensor IC 480 may be electrically connected to the first antenna 441 and the second antenna 442. The first antenna 441 may include a first antenna radiator ①, a ground (or an antenna ground) G, a first electrical path 401, a third electrical path 403, a first matching circuit 451, a third matching circuit 453, a first protection circuit 461, or a third protection circuit 463. The second antenna 442 may include a second antenna radiator ②, a ground (or an antenna ground) G, a second electrical path 402, a fourth electrical path 404, a second matching circuit 452, a fourth matching circuit 454, a second protection circuit 462, or a fourth protection circuit 464.

According to an embodiment, the electronic device 200 may include the fifth electrical path 405 between the sensor IC 480 and the first antenna 441 and the first band stop filter 471 disposed in the fifth electrical path 405. In case that the communication circuit 440 transmits and/or receives a first frequency signal (e.g., a first RF signal) in a first frequency band through the first antenna 441, the first band stop filter 471 may substantially prevent the first frequency signal from being transferred to the sensor IC 480 through the fifth electrical path 405.

According to an embodiment, the electronic device 200 may include a first capacitor CAP1 disposed in series on the fifth electrical path 405 between the sensor IC 480 and the first band stop filter 471.

According to an embodiment, the electronic device 200 may include an eighth electrical path 408 configured to electrically connect the first antenna 441 and the second antenna 442. For example, the eighth electrical path 408 may connect one point on the first electrical path 401 between the first antenna radiator ① and the first protection circuit 461 and one point on the second electrical path 402 between the second antenna radiator ② and the second protection circuit 462. The electronic device 200 may include a circuit 1000 disposed in the eighth electrical path 408. According to an embodiment, the circuit 1000 may include a third band stop filter 473 and a second capacitor CAP2. According to some embodiments, the third band stop filter 473 may be realized to include the second capacitor CAP2. The third band stop filter 473 may separate a frequency band utilized by the first antenna 441 and a frequency band utilized by the second antenna 442 and thus may reduce interference therebetween to secure antenna radiation performance of the first antenna 441 and antenna radiation performance of the second antenna 442.

According to an embodiment, a magnetic field generated by the first antenna radiator ① in the first grip state may be changed by a capacitance generated by a dielectric substance (e.g., the right hand). Due to the capacitance generated by a dielectric substance, the total capacitance measured by the sensor IC 480 may substantially reach the first capacitance of the first capacitor CAP1. The total capacitance measured by the sensor IC 480 in the first grip state may be determined by a capacitance in a state in which there is no grip on the second antenna 442 and a first capacitance C1 of the first capacitor CAP1.

According to an embodiment, a magnetic field generated by the second antenna radiator ② in the second grip state may be changed by a capacitance generated by a dielectric substance. Due to a capacitance generated by a dielectric substance, the total capacitance measured by the sensor IC 480 may substantially reach a third capacitance which is a sum of the first capacitance of the first capacitor CAP1 and the second capacitance of the second capacitor CAP2. The total capacitance measured by the sensor IC 480 in the second grip state may be determined by a capacitance in a state in which there is no grip on the first antenna 441 and the third capacitance. The difference between the total capacitance measured in the first grip state and the total capacitance measured in the second grip state may allow determination of the first grip state and the second grip state. For example, the first grip state may be a state of contact with or proximity to the first antenna 441 and the second grip state may be a state of contact with or proximity to the second antenna 442.

According to various embodiments, instead of the first antenna radiator ①, a third antenna radiator ③ located in the internal space of the electronic device 200 may be implemented. According to various embodiments, instead of the second antenna radiator ②, a fourth antenna radiator ④ located in the internal space of the electronic device 200 may be implemented.

According to an embodiment of the disclosure, an electronic device (e.g., the electronic device 200 in FIG. 4) may include a first antenna (e.g., the first antenna 441 in FIG. 4) and a second antenna (e.g., the second antenna 442 in FIG. 4). The electronic device may include a communication circuit (e.g., the communication circuit 440 in FIG. 4) configured to transmit and/or receive a signal in a frequency band predetermined or selected through the first antenna and/or the second antenna. The electronic device may include a sensor IC (e.g., the sensor IC 480 in FIG. 4) electrically connected to the first antenna and the second antenna and configured to measure a capacitance. The electronic device may include a first capacitor (e.g., the first capacitor CAP1 in FIG. 4 or 8) connected to a first electrical path (e.g., the fifth electrical path 405 in FIG. 4 or the seventh electrical path 407 in FIG. 8) between the first antenna and the sensor IC. The electronic device may include a second capacitor (e.g., the second capacitor CAP2 in FIG. 4 or 8) connected to a second electrical path (e.g., the sixth electrical path 406 in FIG. 4 or 8) between the second antenna and the sensor IC.

According to an embodiment of the disclosure, the first electrical path (e.g., the fifth electrical path 405 in FIG. 4 or 8) and the second electrical path (e.g., the sixth electrical path 406 in FIG. 4 or 8) may be branched from one electrical path (e.g., the seventh electrical path 407 in FIG. 4 or 8) electrically connected to the sensor IC (e.g., the sensor IC 480 in FIG. 4 or 8).

According to an embodiment of the disclosure, the second electrical path (e.g., the sixth electrical path 406 in FIG. 4 or 8) may extend from one point on the first electrical path (e.g., the fifth electrical path 405 including the seventh electrical path 407 in FIG. 4 or 8).

According to an embodiment of the disclosure, the first capacitor (e.g., the first capacitor CAP1 in FIG. 8) may be connected to the first electrical path (e.g., the fifth electrical path 405 including the seventh electrical path 407 in FIG. 8) between the point and the sensor IC (e.g., the sensor IC 480 in FIG. 8).

According to an embodiment of the disclosure, the first capacitor (e.g., the first capacitor CAP1 in FIG. 4) may be connected to the first electrical path (e.g., the fifth electrical path 405 including the seventh electrical path 407 in FIG. 4) between the point and the first antenna (e.g., the first antenna 441 in FIG. 4).

According to an embodiment of the disclosure, the first capacitor (e.g., the first capacitor CAP1 in FIG. 4) and the second capacitor (e.g., the second capacitor CAP2 in FIG. 4) may have different capacitances.

According to an embodiment of the disclosure, the second electrical path (e.g., the eighth electrical path 408 in FIG. 9) may electrically connect the first antenna (e.g., the first antenna 441 in FIG. 9) and the second antenna (e.g., the second antenna 442 in FIG. 9).

According to an embodiment of the disclosure, the electronic device (e.g., the electronic device 200 in FIG. 9) may further include a band stop filter (e.g., the third band stop filter 473 in FIG. 9) connected to the second electrical path (e.g., the eighth electrical path 408 in FIG. 9).

According to an embodiment of the disclosure, the electronic device (e.g., the electronic device 200 in FIG. 4) may further include a first band stop filter (e.g., the first band stop filter 471 in FIG. 4) connected to the first electrical path (e.g., the fifth electrical path 405 in FIG. 4) between the first antenna (e.g., the first antenna 441 in FIG. 4) and the first capacitor (e.g., the first capacitor CAP1 in FIG. 4). The electronic device may further include a second band stop filter (e.g., the second band stop filter 472 in FIG. 4) connected to the second electrical path (e.g., the sixth electrical path 406 in FIG. 4) between the second antenna (e.g., the second antenna 442 in FIG. 4) and the second capacitor (e.g., the second capacitor CAP2 in FIG. 4).

According to an embodiment, the first band stop filter (e.g., the first band stop filter 471 in FIG. 4) or the second reject filter (e.g., the second band stop filter 472 in FIG. 4) may include an inductor (e.g., the first inductor L1 or the second inductor L2 in FIG. 5).

According to an embodiment of the disclosure, the first antenna (e.g., the first antenna 441 in FIG. 4, 8, or 10) or the second antenna (e.g., the second antenna 442 in FIG. 4, 8, or 10) may include an antenna radiator (e.g., the first antenna radiator ① or the second antenna radiator ② in FIG. 4, 8, or 10) including at least a portion of a lateral bezel structure (e.g., the lateral bezel structure 218 in FIG. 4 or 8) configured to form a lateral surface of the electronic device.

According to an embodiment of the disclosure, the first antenna (e.g., the first antenna 441 in FIG. 4, 8, or 10) or the second antenna (e.g., the second antenna 442 in FIG. 4, 8, or 10) may further include a capacitor (e.g., the first protection circuit 461 or the second protection circuit 462 in FIG. 4, 8, or 10) which is connected to an electrical path between the antenna radiator (e.g., the first antenna radiator ① or the second antenna radiator ② in FIG. 4, 8, or 10) and the communication circuit (the communication circuit 440 in FIG. 4, 8, or 10) and used by the sensor IC (e.g., the sensor IC 480 in FIG. 4, 8, or 10).

According to an embodiment of the disclosure, the first antenna (e.g., the first antenna 441 in FIG. 4, 8, or 10) or the second antenna (e.g., the second antenna 442 in FIG. 4, 8, or 10) may further include a capacitor (e.g., the third protection circuit 463 or the fourth protection circuit 464 in FIG. 4, 8, or 10) which is connected to an electrical path between the antenna radiator (e.g., the first antenna radiator ① or the second antenna radiator ② in FIG. 4, 8, or 10) and a ground (e.g., the ground G in FIG. 4, 8, or 10) included in the electronic device and used by the sensor IC (e.g., the sensor IC 480 in FIG. 4, 8, or 10).

According to an embodiment of the disclosure, the first antenna (e.g., the first antenna 441 in FIG. 4, 8, or 10) or the second antenna (e.g., the second antenna 442 in FIG. 4, 8, or 10) may include an antenna radiator (e.g., the third antenna radiator ③ or the fourth antenna radiator ④ in FIG. 4, 8, or 10) located inside the electronic device.

According to an embodiment of the disclosure, the first antenna (e.g., the first antenna 441 in FIG. 4, 8, or 10) or the second antenna (e.g., the second antenna 442 in FIG. 4, 8, or 10) may further include a matching circuit (e.g., the first matching circuit 451, the second matching circuit 452, the third matching circuit 453, or the fourth matching circuit 454 in FIG. 4, 8, or 10). The matching circuit may be controlled according to the capacitance measured by the sensor IC (e.g., the sensor IC 480 in FIG. 4, 8, or 10).

According to various embodiments of the disclosure, an electronic device (e.g., the electronic device 200 in FIG. 4 or 8) may include a first antenna (e.g., the first antenna 441 in FIG. 4 or 8) and a second antenna (e.g., the second antenna 442 in FIG. 4 or 8). The electronic device may include a communication circuit (e.g., the communication circuit 440 in FIG. 4 or 8) configured to transmit and/or receive a signal in a frequency band predetermined or selected through the first antenna and/or the second antenna. The electronic device may include a sensor IC (e.g., the sensor IC 480 in FIG. 4 or 8) configured to measure a capacitance. The electronic device may include a first electrical path (e.g., the seventh electrical path 407 in in FIG. 4 or 8) electrically connected to the sensor IC. The electronic device may include a second electrical path (e.g., the fifth electrical path 405 in FIG. 4 or 8) branched from the first electrical path and electrically connected to the first antenna. The electronic device may include a third electrical path (e.g., the sixth electrical path 406 in FIG. 4 or 8) branched from the first electrical path and electrically connected to the second antenna. The electronic device may include a first capacitor (e.g., the first capacitor CAP1 in FIG. 4 or 8) connected to the first electrical path or the second electrical path. The electronic device may include a second capacitor (e.g., the second capacitor CAP2 in FIG. 4 or 8) connected to the third electrical path.

According to various embodiments of the disclosure, in case that the first capacitor (e.g., the first capacitor CAP1 in FIG. 4) is connected to the second electrical path (e.g., the fifth electrical path 405 in FIG. 4), the first capacitor and the second capacitor (e.g., the second capacitor CAP2 in FIG. 4) may have different capacitances.

According to various embodiments of the disclosure, the electronic device (e.g., the electronic device 200 in FIG. 4 or 8) may further include a first band stop filter (e.g., the first band stop filter 471 in FIG. 4 or 8) connected to the second electrical path (e.g., the fifth electrical path 405 in FIG. 4 or 8) between the first antenna (e.g., the first antenna 441 in FIG. 4 or 8) and the first capacitor (e.g., the first capacitor CAP1 in FIG. 4 or 8). The electronic device may further include a second band stop filter (e.g., the second band stop filter 472 in FIG. 4 or 8) connected to the third electrical path (e.g., the sixth electrical path 406 in FIG. 4 or 8) between the second antenna (e.g., the second antenna 442 in FIG. 4 of FIG. 8) and the second capacitor (e.g., the second capacitor CAP2 in FIG. 4 or 8).

According to various embodiments of the disclosure, the first antenna (e.g., the first antenna 441 in FIG. 4 or 8) or the second antenna (e.g., the second antenna 442 in FIG. 4 or 8) may include an antenna radiator (e.g., the first antenna radiator ① or the second antenna radiator ② in FIG. 4 or 8) including at least a portion of a lateral bezel structure (e.g., the lateral bezel structure 218 in FIG. 4 or 8) configured to form a lateral surface of the electronic device.

According to various embodiments of the disclosure, the first antenna (e.g., the first antenna 441 in FIG. 4 or 8) or the second antenna (e.g., the second antenna 442 in FIG. 4 or 8) may further include a third capacitor (e.g., the first protection circuit 461, the second protection circuit 462, the third protection circuit 463, or the fourth protection circuit 464 in FIG. 4 or 8) which is connected to an electrical path between the antenna radiator (e.g., the first antenna radiator ① or the second antenna radiator ② in FIG. 4 or 8) and a ground (e.g., the ground G in FIG. 4 or 8) included in the electronic device or an electrical path between the antenna radiator and the communication circuit (e.g., the communication circuit 440 in FIG. 4 or 8) and used by the sensor IC (e.g., the sensor IC 480 in FIG. 4 or 8).

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a first antenna;
   a second antenna;
   a communication circuit configured to transmit or receive a signal through at least one of the first antenna or the second antenna, the signal being transmitted or received in a selected or predetermined frequency band through the at least one of the first antenna or the second antenna;
   a sensor integrated circuit (IC) electrically connected to the first antenna and the second antenna and configured to measure a capacitance;
   a first capacitor included in a first electrical path, the first antenna and the sensor IC being connected through the first electrical path including the first capacitor; and
   a second capacitor included in a second electrical path, the second antenna and the sensor IC being connected through the second electrical path including the second capacitor.

2. The electronic device of claim 1, wherein the second electrical path branches from the first electrical path.

3. The electronic device of claim 1, wherein the second electrical path extends from the first electrical path.

4. The electronic device of claim 3, wherein the first capacitor is connected to the first electrical path between a connection at where the second electrical path extends from the first electrical path and the sensor IC.

5. The electronic device of claim 3, wherein the first capacitor is connected to the first electrical path between a connection at where the second electrical path extends from the first electrical path and the first antenna.

6. The electronic device of claim 1, wherein the first capacitor and the second capacitor have different capacitances.

7. The electronic device of claim 1, wherein the second electrical path electrically connects the first antenna and the second antenna.

8. The electronic device of claim 7, further comprising:
   a band stop filter connected to the second electrical path.

9. The electronic device of claim 1, further comprising:
   a first band stop filter connected to the first electrical path between the first antenna and the first capacitor; and
   a second band stop filter connected to the second electrical path between the second antenna and the second capacitor.

10. The electronic device of claim 9, wherein the first band stop filter or the second band stop filter comprises an inductor.

11. The electronic device of claim 1, wherein the first antenna or the second antenna comprises an antenna radiator comprising at least a portion of a lateral bezel structure forming a lateral surface of the electronic device.

12. The electronic device of claim 11,
   wherein the first antenna or the second antenna further comprises a capacitor connected to an electrical path between the antenna radiator and the communication circuit, and
   wherein the capacitor is used by the sensor IC.

13. The electronic device of claim 11,
wherein the first antenna or the second antenna further comprises a capacitor connected to an electrical path between the antenna radiator and a ground included in the electronic device, and
wherein the capacitor is used by the sensor IC.

14. The electronic device of claim 1, wherein the first antenna or the second antenna comprises an antenna radiator located inside the electronic device.

15. The electronic device of claim 1,
wherein the first antenna or the second antenna comprises a matching circuit, and
wherein the matching circuit is controlled according to the capacitance measured by the sensor IC.

16. The electronic device of claim 15,
wherein the matching circuit comprises one capacitor connected in series to the first electrical path, a first inductor connected to the first electrical path on a first side of the one capacitor, and a second inductor connected to the first electrical path on a second side of the one capacitor, and
wherein the matching circuit is configured to match an impedance of the first electrical path to an impedance of a first antenna radiator of the first antenna.

17. The electronic device of claim 1,
wherein the first electrical path comprises a first conductive structure connecting the communication circuit and a first antenna radiator of the first antenna, and
wherein the second electrical path comprises a second conductive structure connecting the communication circuit and a second antenna radiator of the second antenna.

18. The electronic device of claim 1,
wherein the first antenna comprises a first antenna radiator, a first ground, a first matching circuit, a third matching circuit, a first protection circuit, and a third protection circuit,
wherein the first matching circuit comprises at least one capacitor connected in series to a first antenna electrical path connecting the first antenna to the communication circuit,
wherein the second antenna comprises a second antenna radiator, a second ground, a second matching circuit, a fourth matching circuit, a second protection circuit, and a fourth protection circuit, and
wherein the second matching circuit comprises at least one capacitor connected in series to a second antenna electrical path connecting the second antenna to the communication circuit.

19. The electronic device of claim 1,
wherein the first antenna is connected to sensor IC via the first electrical path and connected to the communication circuit via a first antenna electrical path separate from the first electrical path,
wherein the second antenna is connected to sensor IC via the second electrical path and connected to the communication circuit via a second antenna electrical path separate from the second electrical path, and
wherein the first electrical path includes the first capacitor connected in series to a first band stop filter and the second electrical path includes the second capacitor connected in series to a second band stop filter.

* * * * *